United States Patent [19]

Baggen et al.

[11] Patent Number: 4,683,572
[45] Date of Patent: Jul. 28, 1987

[54] DECODING DEVICE FOR CODE SYMBOLS PROTECTED BY REED-SOLOMON CODE

[75] Inventors: Constant P. M. J. Baggen; Leonardus M. H. E. Driessen; Rudy W. J. Pollen; Lodewijk B. Vries, all of Eindhoven, Netherlands

[73] Assignee: U.S. Philips Corporation, New York, N.Y.

[21] Appl. No.: 653,255

[22] Filed: Sep. 24, 1984

[30] Foreign Application Priority Data

Feb. 29, 1984 [NL] Netherlands ................ 8400630

[51] Int. Cl.⁴ .................................. G06F 11/10
[52] U.S. Cl. ........................... 371/37; 371/39
[58] Field of Search ............... 371/36, 37, 38, 39, 371/40, 41, 42, 43, 44, 45

[56] References Cited

U.S. PATENT DOCUMENTS

| | | | |
|---|---|---|---|
| 4,322,848 | 3/1982 | Snyder | 371/37 |
| 4,404,674 | 9/1983 | Rhodes | 371/43 |
| 4,432,094 | 2/1984 | Das Gupta | 371/36 |
| 4,519,080 | 5/1985 | Snyder | 371/43 |
| 4,551,842 | 11/1985 | Segarra | 371/36 |

Primary Examiner—Michael R. Fleming
Attorney, Agent, or Firm—Thomas A. Briody; Jack Oisher; William J. Streeter

[57] ABSTRACT

For the decoding of a data stream which is word-wise protected against errors by a double Reed-Solomon code with symbol-wise interleaving over the code words, first the reliability information for the constituent symbols is aggregated for a code word. Therefrom the strategy is determined, entailing the number of erase symbols and the maximum number of error symbols to be corrected. The correction result is compared with a reliability code and on the basis thereof all symbols obtain an at least trivalent secondary reliability indication for decoding in the second code.

13 Claims, 18 Drawing Figures

```
29 NAD6  Next address
28 NAD5   "       "
27 NAD4   "       "
26 NAD3   "       "

25 NAD2   "       "
24 NAD1   "       "
23 NAD0   "       "
22 COR   Correction

21 RAT   Range test
20 RST1  Operator   { 0 → do nothing    1 → stop, correction impossible
19 RST0    "    "   { 2 → stop, correction completed  3 → jump
18 TST2  test operater     { 0 → ner=0    4 → ner=4
                           { 1 → ner=1    5 → - -
17 TST1    "       "       { 2 → ner=2    6 → sos=0 ?
16 TST0    "       "       { 3 → ner=3    7 → sos=not0 ?
15 IDS   write direct if IDS=0
14 HAD2  H mem. address 13 HAD1   "       "
12 HAD0   "       "
11 WAD1  W mem  address
10 WAD0   "       "

09 BWR   B mem write
08 AWR   A mem write
07 BAC   B accumulate
06 MUL   Multiply 05 INV   Invert
04 SRD   Syndrom read
03 TIM1  Control timing sequencer counter    "00" = 3 cycles  "10" = 5 cycles
02 TIM0    "       "       "         "       "01" = 4 cycles  "11" = 6 cycles 01 WRD   W mem. read
   WWR   W mem. write 00 HRD   H mem. read
   HWR   H mem. write
```

FIG.3c

| outp. DRM7 dec. | inp. NSFL dec. | NCE dec. | $\overline{ERUF}$ bin. | UEP bin. | (e,t) |
|---|---|---|---|---|---|
| 1 | 0 | 0 | x | 0 | 0,0 |
| 2 | 1 | 0 | x | 0 | 1,0 |
| 3 | 1 | 1 | 0 | 0 | 0,1 |
| 4 | 1 | 1 | 1 | 0 | 0,1 |
| 5 | 2 | 0 | x | 0 | 2,0 |
| 6 | 2 | 1 | 0 | 0 | 1,1 |
| 7 | 2 | 1 | 1 | 0 | 1,1 |
| 8 | 2 | 2 | 0 | 0 | 0,2 |
| 9 | 2 | 2 | 1 | 0 | 0,2 |
| 10 | 3 | 0 | x | 0 | 3,0 |
| 11 | 3 | 1 | 0 | 0 | 2,1 |
| 12 | 3 | 1 | 1 | 0 | 2,1 |
| 13 | 4 | 0 | x | 0 | 4,0 |
| 14 | x | x | x | x | uncorr. |

FIG. 6b

ROMS

| DRM7 | FHCO 0 | 1 | 2 | 3 | 4 | 5 | 6 | 7 |
|---|---|---|---|---|---|---|---|---|
| | a b | a b | a b | a b | a b | a b | a b | a b |
| | b: 0 = $\overline{URD}$ | 1 = URD | | | | | | |
| 1 | 0 0 | 0 0 | 0 0 | 3 0 | 2 X | 2 X | n n | 0 X |
| 2 | X 0 | X 0 | 3 0 | 2 0 | 2 X | X X | n n | 0 X |
| 3 | X 0 | 0 0 | X 0 | 2 0 | X X | X X | n n | 0 X |
| 4 | 0 1 | 2 1 | 1 1 | 1 1 | X X | X X | n n | 7 X |
| 5 | X 0 | X 1 | 3 0 | 2 0 | 2 X | X X | n n | 0 X |
| 6 | X 0 | X 1 | X 0 | 2 0 | X X | X X | n n | 0 X |
| 7 | X 1 | X 1 | 2 1 | 1 1 | X X | X X | n n | 7 X |
| 8 | X 0 | X 1 | X 0 | X 0 | X X | X X | n n | 0 X |
| 9 | 2 1 | 2 1 | X 1 | X 1 | X X | X X | n n | 7 X |
| 10 | X 0 | X 1 | X 1 | X 0 | 1 X | X X | n n | 0 X |
| 11 | X 0 | X 1 | X 1 | 2 0 | X X | X X | n n | 0 X |
| 12 | X 1 | X 1 | 1 1 | 1 1 | X X | X X | n n | 7 X |
| 13 | X 0 | X 1 | X 1 | X 1 | 1 X | X X | n n | 0 X |
| 14 | 1 1 | 1 1 | 1 1 | 1 1 | 1 X | 1 X | n n | 7 X |

DECODING DEVICE FOR CODE SYMBOLS PROTECTED BY REED-SOLOMON CODE

BACKGROUND OF THE INVENTION

The invention relates to a decoding device for a stream of successively receivable code symbols which are protected against errors by a first and a second Reed-Solomon code. Each of the symbols of a code word of the second code being assigned to an respective code word of the first code. The decoding device comprises a first input for code symbols of the first code and associated reliability information. A storage means stores any updated symbols of the first code until at least all symbols of a code word of the second code are present together. A first arithmetic means forms the syndrome symbols for any code word of a code. A second arithmetic means are fed by the first arithmetic means in order to form, on the basis of the code symbols received, the syndrome symbols found and, if desired, also on the basis of reliability information associated with the latter code symbols, updating information which consists of locator information and error information for the presentation of data symbols of the second code, whether or not updated by means of the updating information, on a user output. Flag processing means are provided for adding, on the basis of reliability information associated with a code, word of the first code and the processing result of the second arithmetic means on a code word of the first code, signalization information which has been modified or not to symbols to be included in a code word of the second code. A device of this kind is known from the previous Netherlands Patent Application No. 8200207 corresponding to U.S. Pat. No. 4,477,903 in the name of Applicant. According to the present state of the art, code symbols may be provided with an invalidity bit upon demodulation. This bit can be used in various ways. When the code word contains an excessive number of flagged code symbols, all symbols of the relevant code word are provided with an invalidity bit. On the other hand, when a symbol provided with an invalidity bit is not corrected, if desired, all symbols of the relevant code word are also provided with an invalidity bit. Thirdly, within given limits the invalidity bit can be used as an error locator, so that the correction capability of the code as a whole is increased. The inventors of the present invention have found that such a strategy where the invalidity bit indicates either correct or incorrect code symbol is not very flexible and also results in an excessively restricted use of the possibilities of the code. It is an object of the invention to increase the flexibility and correction capability of the code by utilizing multivalent flag information per code symbol.

SUMMARY OF THE INVENTION

The object in accordance with the invention is achieved in that there is provided a first strategy-determining device which comprises a first input for receiving aggregate reliability information of a code word of a first code in order to determine a decoding strategy. The strategy entils a predetermined number of erase symbols to be treated in the relevant code word and a maximum number of error symbols which is accepted as being correctable. The flag processing means comprises a flag hardening element which comprises a first input for word-wise receiving signalization information concerning the decoding of the first code, a second input for receiving a risk indication code from the strategy-determining device. A first output forms, for each symbol of the relevant code word, at least trivalent secondary flag information for the decoding of the second code. The strategy to be followed can thus be adapted in order to achieve an optimum result. Furthermore, the result of this strategy is also used to generate secondary reliability for the second code.

Preferably, there is provided a second strategy-determining device which comprises an input for receiving aggregate reliability information of a code word of the second code, formed on the basis of the secondary flag information, in order to determine a decoding strategy. The decoding strategy is based on a predetermined number of erase symbols to be treated in the relevant code word, and a maximum number of error symbols which is accepted as being correctable. Thus, on the basis of the aggregate reliability information of the second code the strategy is again optimized.

Preferably, the flag-hardening element for the decoding of a code word of the second code comprises a third input for receiving for each code symbol the multivalent secondary flag information and a correction indication, and a fourth input for receiving from the strategy-determining device a first discrimination code for selectively assigning to symbols which are indicated by the secondary flag information as being below a predetermined reliability level in a reject signal on a second output connected to a user device. Thus, on the basis of the decoding result of the second code a realistic prognosis is given as regards the (un)reliability of the user symbols.

Preferably, the flag-hardening element comprises logic means for forming a blocking/unblocking signal for the second output thereof on the basis of information received on its first and its second input. Unblocking, therefore, takes place when the decoding result is poor in view of the overall prognosis for the relevant code word, be it only for symbols already provided with a flag bit.

The invention also relates to a player for optically readable media which comprises a decoding device of the described kind and in which a single strategy determining device is provided which alternately acts on a word of the first code and a word of the second code while utilizing the same components. This results in an advantageous saving of materials.

BRIEF DESCRIPTION OF THE FIGURES

The invention will be described in detail hereinafter, starting with a short description of the code, the background and the philosophy of the invention, followed by a general description of the decoding device and the sub-systems forming part thereof, notably the actual decoder as distinct from routing elements, intermediate storage for data and flag information, and strategy determining device.

FIG. 3c illustrates the meaning of a number of signals;

FIGS. 6a, 6b, 6c show a diagram of the flag hardening element (66 in FIG. 2);

DESCRIPTION OF THE PREFERRED EMBODIMENT

Figure 1:
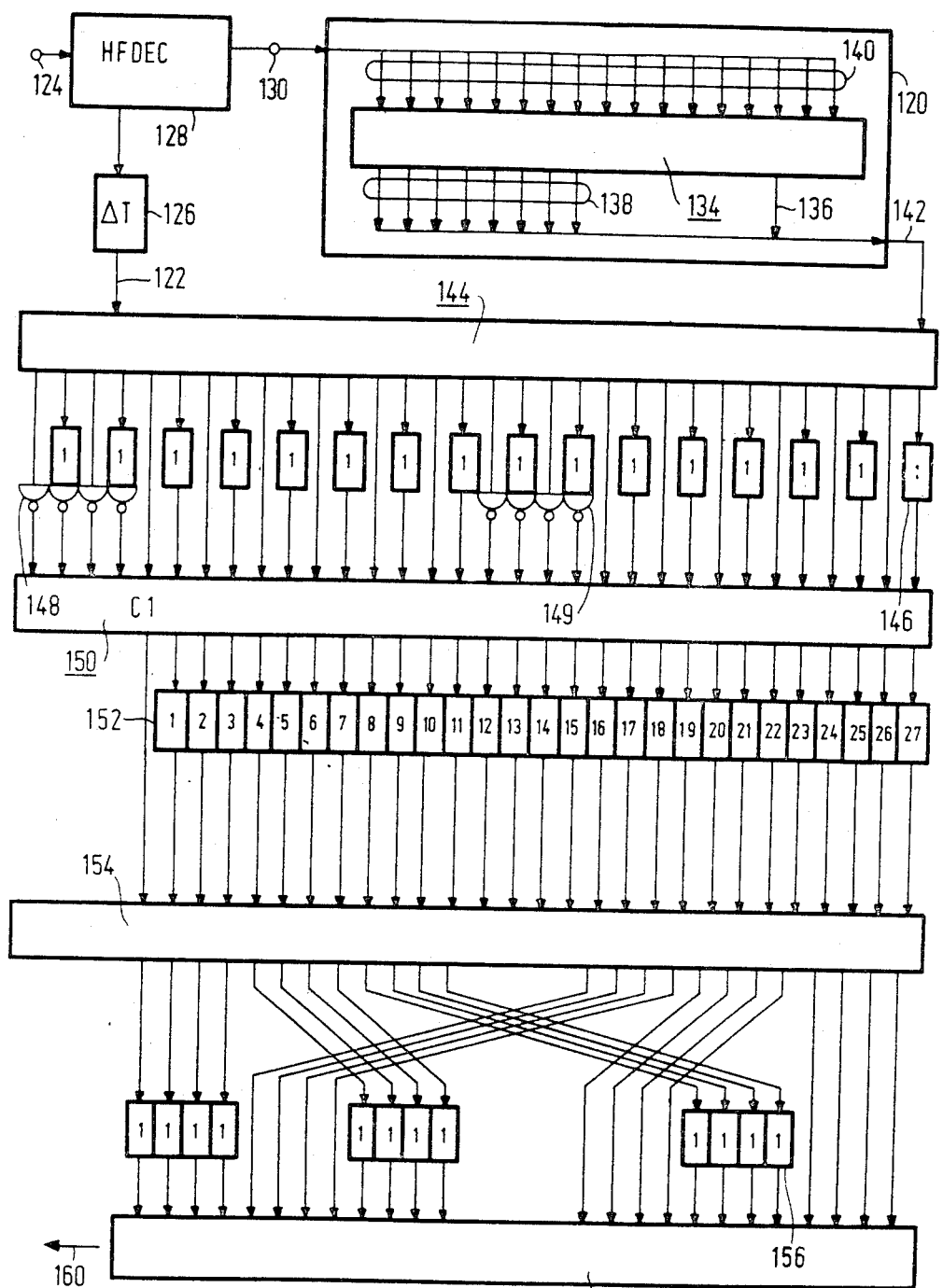
FIG. 1 symbolically illustrates the code, the demodulation and the decoding.
Figure 2:
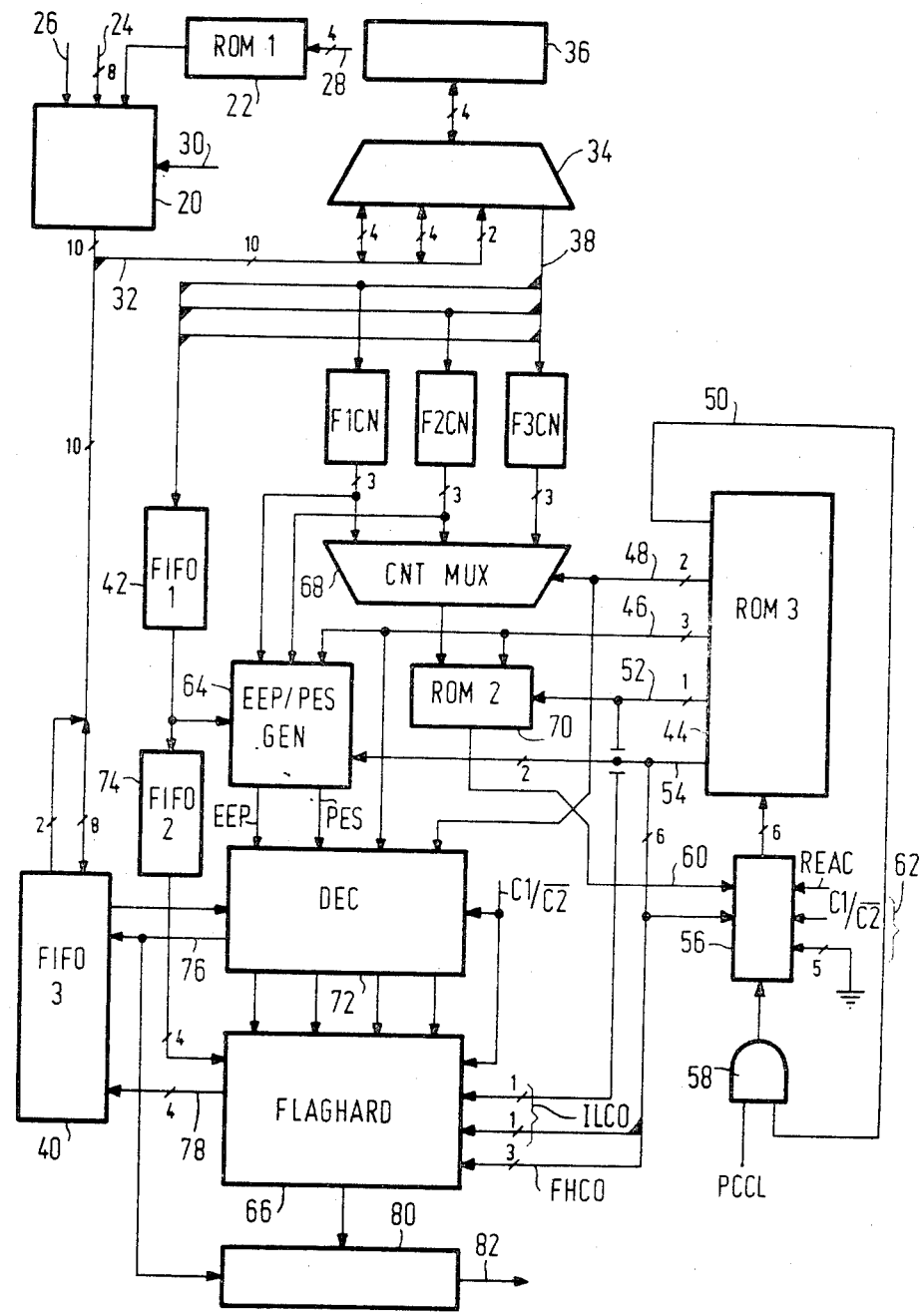
FIG. 2 shows a general block diagram of the decoding device.

FIG. 1 is a symbolical representation of the decoding device; FIG. 2 shows the construction thereof with the actual components and sub-systems. The signals originating from an optically readable record arrive on input 124. The signals are analog signals which are organized in blocks according to channel symbols, followed by a control symbol. The further organization of the block is as follows. Twelve data symbols, followed by four redundancy symbols, followed by another twelve data symbols, and finally another four redundancy symbols.

The last four redundancy symbols per block concern a first Reed-Solomon code. The other redundancy symbols concern a second Reed-Solomon code. Both Reed-Solomon codes have a minimum distance $d=5$. Per code word a number of e erase symbols (position known, error value unknown) and a number of t error symbols (neither position nor error value known) can be corrected and, moreover, a number of s error symbols can be detected (position unknown, error value not considered), so that $e+2t+s \leq d-1$. The code is commercially used in the so-called "Compact Disc" system for optically readable, rotatably driven records for the storage of high-quality audio information. The invention, however, is not restricted to such use.

Block 128 represents the high-frequency decoder and synchronization device. This block first of all comprises an analog detector for the HF envelope of the signal received. The high-frequency amplitude is a measure for the signal-to-noise ratio and hence for the realibility of the signal received. This amplitude is compared with a discrimination value and converted into a binary signal. Subsequently, block 128 comprises a discriminator at the channel bit level in order to form a stream of channel bits from the channel signal. These bits are formed under the control of a bit synchronization signal which is derived from the channel signal, for example by means of a phase-locked loop. The block 128 furthermore comprises detection means for detecting said synchronization symbols from the channel bits and for making a majority decision between a number of, for example three successive synchronization symbols (of each time associated blocks) in order to form a block synchronization signal. When this majority decision is a three-out-of-three decision, a positive indication is obtained as regards the realibility of the information received. If this is a two-out-of-three decision, a negative indication is obtained. The failing synchronization symbol may be incorrect so that it cannot be recognized. Alternately, it may be that the mutual positions of successive synchronization symbols have been influenced, so that their spacing is incorrect. Other synchronization qualifications can also be used.

Block 128 thus outputs four categories of signals:
the channel bits on line 130;

the bit/synchronization signals, which are also applied to block 120 in order to synchronize the further demodulation therein;

the block synchronization signals which are also applied to the block 120 and to the actual decoder/de-interleaving device (element 144 and further) in order to indicate the beginning and the end of a channel block (the synchronization connections have been omitted for the sake of simplicity);

the reliability indications which are delayed in element 126 and applied to the further device after a delay (corresponding to the delay in the block 120). The reliability/unreliability is each time indicated per symbol. The reliability of the synchronization is indicated in the same way for all symbols of a block. For the sake of brevity, the components of the sub-systems 128 will not be elaborated upon herein.

The channel words thus serially arrive on the connection 130. The data symbols and redundancy channel symbols always comprise fourteen channel bits plus each time three spacing bits. In demodulator 120 first a series-to-parallel conversion is performed, so that each time a complete channel symbol with spacing bits becomes available on connection 140. The actual series-to-parallel converter and the necessary block system have been omitted for the sake of simplicity. Block 134 represents a translation element which converts a correctly received fourteen-bit channel symbol into the corresponding 8-bit code symbol on the 8-fold connection 138 plus a "zero" on the connection 136. If the channel word is not correct, various possibilities exist. First of all, it may be that an arbitrary symbol is formed on the connection 138, for example "00000000" and a logic "1" on the connection 136. Alternatively, the incorrect channel symbol may be translated into a correct channel symbol which corresponds as well as possible thereto, the corrected channel symbol being translated into the corresponding code symbol (evidently, this can be performed in one operation). Sometimes a single-bit error in a channel symbol can be repaired; in cases where several code symbols can be formed with the same probability (same Hamming distance between incorrect channel symbol and several correct channel symbols) one of the correct code symbols is chosen as a substitute in accordance with a predetermined strategy. Generally, multibit errors cannot be properly corrected. The translation of a correct channel symbol into the corresponding 8-bit demodulated symbol is subsequently performed. This translation may also be implicitly performed so that demodulation is executed in one operation. The reception of an incorrect channel symbol may be signalled on the connection 136 by means of a flag bit which is unequal to zero. This is not implemented in the preferred embodiment. Further flag bits which are to be generated during demodulation will be described hereinafter. The preferred embodiment involves two of such further flag bits. Thus, on output 142 a code symbol appears each time in conjunction with two flag bits from the demodulator 120, and also further reliability information concerning this code symbol on line 122, and a synchronizing clock signal on a connection from block 128 which has been omitted for the sake of simplicity. The demodulation itself is described in the published Netherlands Patent Application No. 8004028 in the name of Applicant. In addition to the above possibilities, there are other possibilities of signalling the reliability of a code symbol. Block 134 may be constructed as a read-only memory having an address with a width of 14 bits and an output data path having a width of 10 bits (or possibly more bits). The spacing bits (three) each time present between two successive channel symbols are ignored for the conversion into code bits. If desired, the spacing bits may be taken into account for the formation of the reliability information, because they must also satisfy the modulation restriction. The spacing bits may then be considered to form part of the directly preceding channel symbol.

For the error correction in the remainder of the circuit, the control and synchronization symbols are ignored. Block 144 represents a demultiplexer comprising a multiple input 142 and 32 parallel outputs. Demultiplexing is performed symbol-wise, so that each output receives one, complete code symbol, including the associated reliability information. In the preferred embodiment (FIG. 2f) demultiplexing is performed in the time domain. Blocks which are indicated by the digit "1", like the block 146, delay the symbols applied thereto by a period of time which corresponds to the period during which exactly 32 symbols, including the associated reliability information, arrive on the connection 142. Elements such as the elements 148, 149 are inverters which invert the parity symbols of the error correction codes. Element 150 is the reproduction and correction element for the first error correction code, utilizing the published parity check matrix. The parity check matrices of the first and the second code are similar to a very high degree, be it that they have different dimensions. The correction itself will be described in detail hereinafter. Thus, for every 32 symbols received from the element 144, each time 28 eight-bit output symbols appear on the output of the reproduction and correction element 150, all output symbols being accompanied by their own multiple signalling information which will be described hereinafter. Consequently, the aggregate data rate on the output of the element 150 amounts to $28/32 = \frac{7}{8}$ times the symbol rate on the connection 142. The blocks 152 which are denoted by the reference numerals 1 to 27 delay the symbols received in order to introduce a de-interleaving effect. A "1" in a block indicates a delay by a period of time which corresponds to the outputting of a predetermined number (4) of groups of 32 symbols by the element 120. An indication "14" indicates an interval which is 14 times as long. Each symbol of a group of 28 symbols is output together by the element 150 is thus assigned to a relevant newly formed group of 28 symbols. The effect of a burst error is thus spread over a large time interval so that it is achieved that generally each newly formed group of 28 symbols contains no more than a small number of incorrect symbols.

Element 154 is the reproduction and correction element for the second error correction code in which correction can be performed by implementation of the published parity check matrix [H]. The data processing mechanism will be described layer. On the output of the reproduction and correction element 154, therefore, 24 8-bit data symbols appear for each group of 28 (interleaved) input symbols, said data symbols again being accompanied by their own signalling information. The aggregate data rate on the output of the element 154 thus amounts to $24/32 = \frac{3}{4}$ times the symbol rate on the line 142. Blocks which are indicated by a reference numeral "1", like block 156, delay the symbols applied thereto by a period of time which corresponds to the interval during which an integer number (2) of groups of 32 symbols each, including the associated validity bit (bits), arrive on the connection 142. Block 158 is a parallel/series converter for presenting 24 symbols received in the correct sequence on output 160 to a user device (not shown). Each symbol comprises signalling information. 32 data bits (i.e. four data symbols) form exactly one audio read signal for stereo reproduction. Should one of the four data symbols be invalid, either the entire audio signal or a mono-part thereof will be invalidated and replaced by an interpolated signal which is derived from one or more neighbouring audio signals. This masking will not be elaborated upon herein.

BACKGROUND AND PHILOSOPHY OF THE INVENTION

The decoding philosophy is based on the following points:

for the first code (C1, correction in block 150) as well as for the second code (C2, correction in block 154) reliability information of the symbols is used for determining the correction strategy and for achieving a high probability of correction of error symbols and erase symbols by an adapted choice, the risk of incorrect correction being sufficiently small;

for both codes the reliability information of the symbols and the redundancy symbols is used together in a manner determined by the strategy;

for both codes the device is suitable to perform the theoretically maximum correction of error symbols and/or erase symbols;

the decoding of both codes is performed in the same device by multiplex use thereof for the two codes;

the first code allows for the use of different levels of reliability which can be supplied by the preceding sub-systems; however, in the preferred embodiment this number is restricted to two for the sake of simplicity;

in the second code, four levels of reliability are derived (i.e. no flag bit, F3 flag bit, F2 flag bit, F1 flag bit, each time in an increasing order of unreliability). These reliability levels are determined from the information generated during the decoding of the first code, i.e. the decoding strategy followed for the first code, the results of this decoding strategy and the reliability information which is used during this decoding operation and which is supplied by the demodulator;

before the beginning of decoding, the reliability information received is processed in a flag processor which determined the strategy to be followed during decoding, i.e. the number of erase symbols and the maximum number of error symbols in excess of the erase symbols, and which also determines, as part of the foregoing, the locations of erase symbols, the locations of suspect symbols, and which forms output flag bits from the decoding result;

the strategy to be performed by the flag processor is determined by means of a read-only memory; this read-only memory can be easily mask programmed;

the strategy determining device as well as the actual decoder constitutes a sequential machine for each code separately; per code they operate in a pipe line organization, sothat the decoder is activated only after the strategy to be followed has been determined.

FIG. 2 shows a general block diagram of a decoding device in accordance with the invention. The procedure is as follows. Before a code word can be treated, all code symbols thereof must be present in a processing memory (36) together with their reliability information.

The treatment of the code word commences by loading the symbols into the buffer 40 and the primary flag bits thereof into the buffer 42. Meanwhile the various flag bits are counted in counters F(1 ... 3)CN. Subsequently, a sequencer is activated, said sequencer consisting notably of an address counter 56 and a strategy-determining read-only memory 44. Thus, the strategy to be followed during decoding is determined on the basis of the positions of the counters F1 ... 3CN. After the strategy has been determined, a "stop" bit becomes high and the address counter 56 stops. The actual decoding operation then commences; notably the decoder 72, the EEP/PES generator 64 for the formation of secondary flags, and the flag-hardening element 66 are activated in order to generate flag bits for further treatment or for a user. The foregoing will be described in detail hereinafter.

The code symbols arrive with a width of 8 bits on the input 24, together with synchronization pulses on the input 26 and a four-bit wide reliability or signalling information on the input 28. For each symbol this concerns:

A—1 bit which indicates whether the relevant code symbol did not satisfy the maximum series criterion upon demodulation; this criterion is: at the most 10 channel bits between two successive signal transitions.

B—1 bit which indicates whether the minimum series criterion was satisfied; this criterion is: at least three channel bits between two successive signal transition.

C—1 bit which indicates whether the analog signal level of the high frequency envelope was sufficiently high.

D—1 bit which indicates the quality of the synchronization as being "good" or "bad".

These four bits can be decoded so as to form a large number of different reliability levels by way of the read-only memory 22. The choice will be determined by the anticipated types of error. By making the read-only memory mask-programmable, this choice can be readily implemented and modified. In the present embodiment a simple realization is chosen, that is to say a logic OR-function between the reliability bits A and B. If the symbol does not satisfy one (or both) criteria, a primary flag bit F1 is set to "1". It will be apparent that this OR-function is realized by means of a single gate. Notably the above bits C and D are ignored.

Buffer 20 serves for time adaptation of input and output. In an attractive implementation a depth of two symbols suffices. Reading is performed by clock pulses on line 30 as generated by the own clock generator of the circuit (omitted for the sake of simplicity).

Element 34 is a bidirectional (de)multiplexer structure for adaptation to the 4-bit wide read/write memory 36 which serves for adaptation to flow fluctuations on the input 24 and for the decoding notably to implement the de-interleaving. De-interleaving is performed by executing write and read operations each time with predetermined starting addresses and address steps, but this will not be elaborated upon herein for the sake of simplicity. The capacity of the memory amounts to 64 k locations of four bits each. These locations are so large in order to form an adaptation also for fluctuations in the input flow on the connections 24, 26. The 8-bit symbols together with each time 2-bit flag information are to be transported on line 32. As will be explained hereinafter, the first code forms four output reliability levels. These levels are each time coded for storage and transport as a two-bit flag information; for the processing, for example in the counters F1 ... 3CN and the pointer generator which forms the bits EEP/PES, the flag bits F1...3 are used as separate quantities. Each of the counters thus comprises an input decoder which is activated by a specific bit pattern in order to increment the counter.

For the processing of the symbols, they are read from the memory 36 (each time four bits, the reliability information concerning only two bits). Line 38, consequently, has a width of only two bits.

The processing of a code word or frame (32 and 28 symbols, respectively) commences by loading the symbols into a first-in-first-out memory 40, the two-bit flag information being loaded into a first-in-first-out memory 42. In the physical implementation, the first-in-first-out memories 40, 42, 74 are constructed so as to form a single random access read/write memory. This memory has a capacity of 104 locations of 10 bits (symbol +2-bit flag information). In order to simplify the explanation, hereinafter reference will only be made to the first-in-first-out memory. The capacity of this memory can be understood as follows. The first code decoding receives code words of 32 symbols and outputs code words of 28 symbols; the second code decoding receives code words of 28 symbols and outputs code words of 24 symbols. Also considering time adaptation requirements as regards the memory 36, it is attractive when the capacity if almost sufficient for the total content of one of each of these four summed categories of code words.

The flag information is decoded and counted in the counters F1-3CN. For the first code only F1CN is used in the embodiment. At the beginning of the treatment of a code word the counters are reset to zero by a signal which has been omitted for the sake of brevity. When the position "7" (111) is reached at any instant, counting stops. This upper limit is chosen on the basis of the capacity of the code. A higher counting capacity would not offer a further improvement. Such an improvement is detected from the fraction of errors which can be corrected. Moreover, this detection concerns simulated and hence known error locations.

The memory 44 is used to determine the decoding strategy to be followed. This is a read-only memory which is mask-programmable, so that its content can be readily modified in order to obtain an optimum strategy for the relevant application. The embodiment notably concerns the use for the so-called "Compact Disc" system for high-quality digital storage of audio information on an optically readable disk having a diameter of approximately 12 cm. This memory 44 outputs different signals, many outputs being used twice, i.e. once for determining the strategy to be followed which is realized in a decision structure as will be explained hereinafter, and once (after determination of this strategy) for activating the other parts of the circuit. The above decision structure is realized as if it were by means of a special purpose microprocessor which comprises a logic unit 70 (ROM2), a processing memory (F1-3CN, multiplexer 68), a program memory 44 and a program counter 56.

The output 46 of the memory 44 outputs a three-bit signal EVAL which indicates a discrimination quantity. The value thereof must be compared in the read-only memory 70, acting as a comparator, with one of the positions of the counters F1-3CN. Once the strategy to be followed has been determined, this output forms the signal NER for the pointer generator 64 which indicates the number of erase symbols to be treated within the relevant code word, i.e. the quantity "e".

The output 48 of the memory 44 outputs a two-bit signal. When the strategy has not yet been determined, this is the signal FLSL which renders the multiplexer 68 conductive for the position of one of the three counters F1-3CN. After determination of the strategy, this is the signal ANF for the decoder 72 which indicates the maximum number of error signals to be corrected beyond the erase symbols, i.e. the quantity "t". Considering the degree of redundancy, in the present example $e + 2t \leq 4$. Furthermore, the read-only memory 44 outputs a 1-bit stop signal on output 50. As long as this bit is low, the determination of the strategy is still in progress. When it becomes high, the actual decoding commences.

Output 52 of the read-only memory 44 outputs a 1-bit signal. For as long as the strategy is being determined, this signal COTS activates the read-only memory 70. Consequently, either correspondence between the two inputs of the memory or a "larger than" relationship is then tested. Once the strategy has been determined, this signal forms one of the two bits of the first discrimination code ILCO for the flag hardening element 66.

Output 54 of the read-only memory 44 outputs a six-bit signal. For as long as the strategy is being determined, this signal concerns a six-bit address NEAD, so that the counter 56 can be activated to perform address jumps. Once the strategy has been determined, this six-bit quantity is used in parts. Two first bits are applied to the pointer generator (EEP/PES) 64 as the second discrimination code FLGC. One subsequent bit forms the second part of the first discrimination code ILCO (interpolation level code for the flag-hardening element 66). The two bits ILCO∅,1 control operations on the symbol flag bits during the decoding of the second code. The last three bits FHCO (flag hardening code or risk indication code) are also applied to the flag-hardening element 66 in order to process the incoming flag bits in both codes into outgoing flag bits.

The memory 44 thus has a word length of 13 bits. The 6-bit addresses are supplied by the program counter 56 which advances under the control of the clock signals PCCL. Under the control of the signal on the line 50, however, AND-gate 58 may be blocked so that the advancing is stopped. The counter also comprises an input 60 for an "error" signal whereby a jump (loading of a new address NEAD 54) is made or not, or the address for the read-only memory 44 is incremented. Finally, the counter also comprises a reset input REAC in order to reach a starting position at the beginning of decoding. This starting position itself is determined by the signals on inputs 62: five "0" bits and one further bit which is determined by the fact whether the decoding concerns the first code (32 symbols) or the second code (28 symbols). The content of the memory 44 will be described in detail hereinafter.

Under the control of the two-bit signal FLSL on line 48, the multiplexer 68 conducts only one of the counter positions F(1 . . . 3)CN to the read-only memory 70 which acts as a comparator. This memory also receives the previously described three-bit signal EVAL on the line 46 from the memory 44 as comparison material, and selectively performs one of the following two tests under the control of the signal on the line 52: >EVAL or =EVAL.

When the stop bit has become high after the determination of the strategy, the actual decoding may commence. The positions of the counters F1CN, F2CN, F3CN, in as far as they are relevant, and also the number of erase symbols which may be corrected (NER, indicated by the signal on the line 46) are then applied to the pointer generator 64, together with the flag bits from the FIFO 42 and the second discrimination code FLGC. This generator can apply two flag bits to the actual decoder 72 per symbol, i.e.:

EEP: the relevant symbol is an erase symbol.
PES: the relevant symbol is suspect. All erase symbols also have a secondary flag PES in this preferred embodiment.

In as far as is necessary and possible, the element 72 performs the correction of error symbols and erase symbols. To this end, this element inter alia comprises storage space for an entire code word. At the same time the directly preceding code word can be output after treatment, and the directly subsequent code word can be input before treatment. The primary flag bit information of the buffer memory 42 is then transferred to a further buffer memory 74 whose capacity suffices to bridge the storage delay in the decoder 72. It is alternatively possible to realize the latter storage also in the decoder 72.

The decoder 72 receives a one-bit control signal for discrimination between the "long" and "short" code words of the relevant codes (32 and 28 symbols).

After decoding, the symbols (corrected or not) are output by the element 72. The element 72 then outputs a quantity of information which first of all concerns each time one symbol.

SFL indicates that the relevant symbol has been corrected with a symbol other than zero. Thus, this may be an erase symbol or an error symbol. An erase symbol having the correction "zero", therefore, is not indicated.

Furthermore, concerning the entire code word:
UEP (1 bit): the code word is not correctable.
NEE (2 bits): the number of error symbols found beyond the number of corrected erase symbols.
NSFL (3 bits) indicates the number of symbols for which the bit SFL has the value "1".
ERUF (1 bit) indicates that an additional error symbol has been found in a symbol position not indicated by the flag bit PES.

During the decoding of the first code, FIFO 42 thus acts to store the reliability flags until the signals EEP and PES have been formed. FIFO 74 acts for the subsequent storage of the reliability flags, while the code symbols and the flags EEP and PES are received in the decoder 72 in order to effect the correction. After completion of the decoding, the decoded 8-bit symbols appear on output 76. The per code symbol and also the associated reliability flags from 74 are applied to the flag-hardening element 66. When the first code (C1) is concerned, the processing results are output again on output 78, after a short processing operation in order to provide each of the associated symbols with an indication as regards the reliability. The symbols stored in the buffer 40 are then applied together with their reliability flags, to the memory 36 for storage via the line 32 and the multiplexer 34. For the second code, the code symbols of a code word are read at the correct addresses of the memory 36 in order to cancel the interleaving in the time domain. The further supply to buffers and the decoding device 72 is performed in the same manner as described for the first code. The difference consists in that:

the strategy decisions may be different;
the word length is smaller;
when the decoded symbols are output, they may be applied to the element 80 after treatment of the flag information in the flag-hardening element 66.

Element 80 also receives a decision flag URD from the flag-hardening element 66 together with the associated code symbol. The latter flag is bivalent. When its value indicates that the decision is negative, the relevant code symbol must be masked, for example by interpolation or by means of a filter. The element 80 also serves to effect the de-interleaving by the elements such as 156 in FIG. 1. Further signals processing elements may be connected to the output 82.

DESCRIPTION OF THE DECODER 72

Figure 3A:
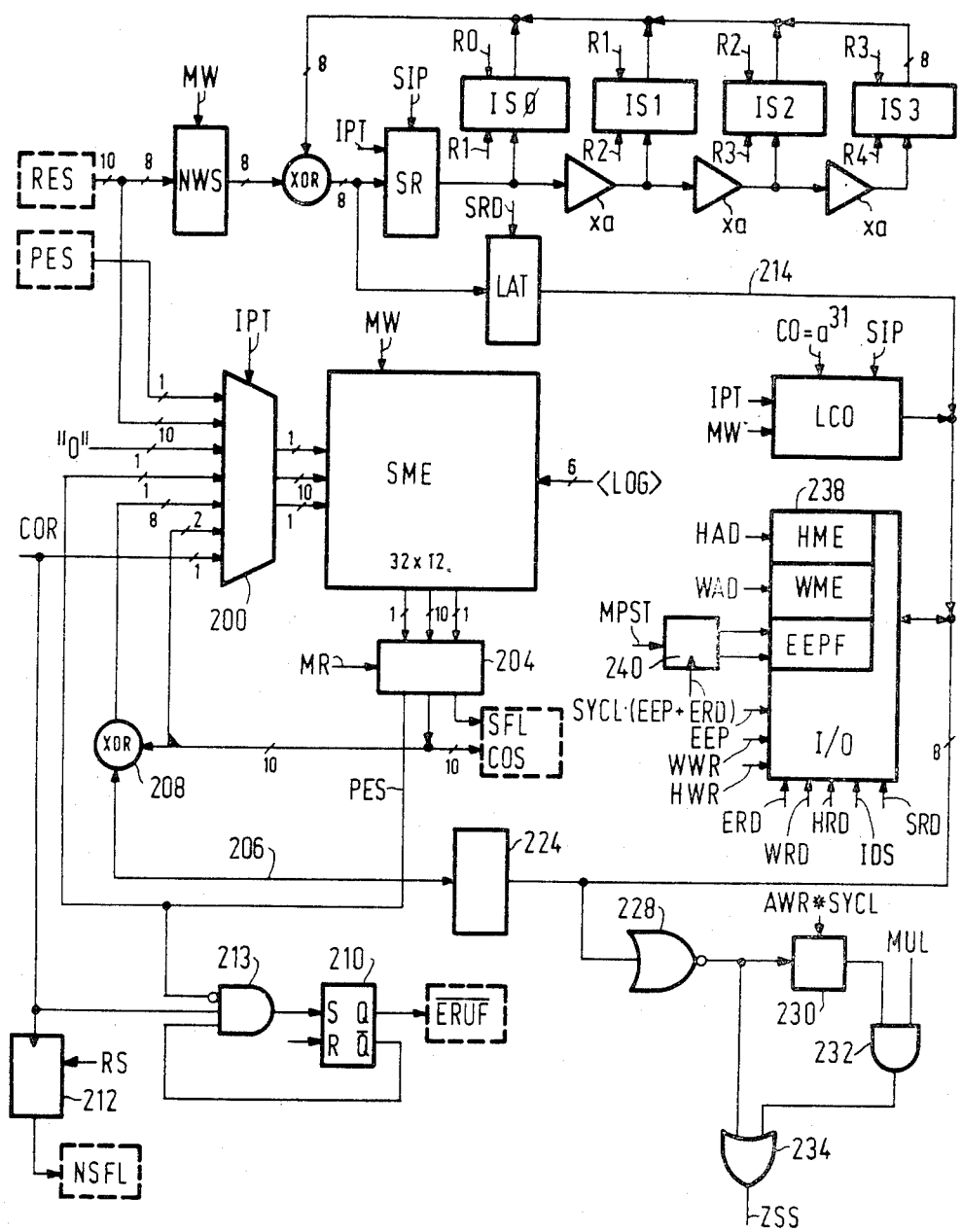
FIGS. 3a, 3b show a detailed block diagram of the actual decoder (element 72 in FIG. 2)
Figure 3B:
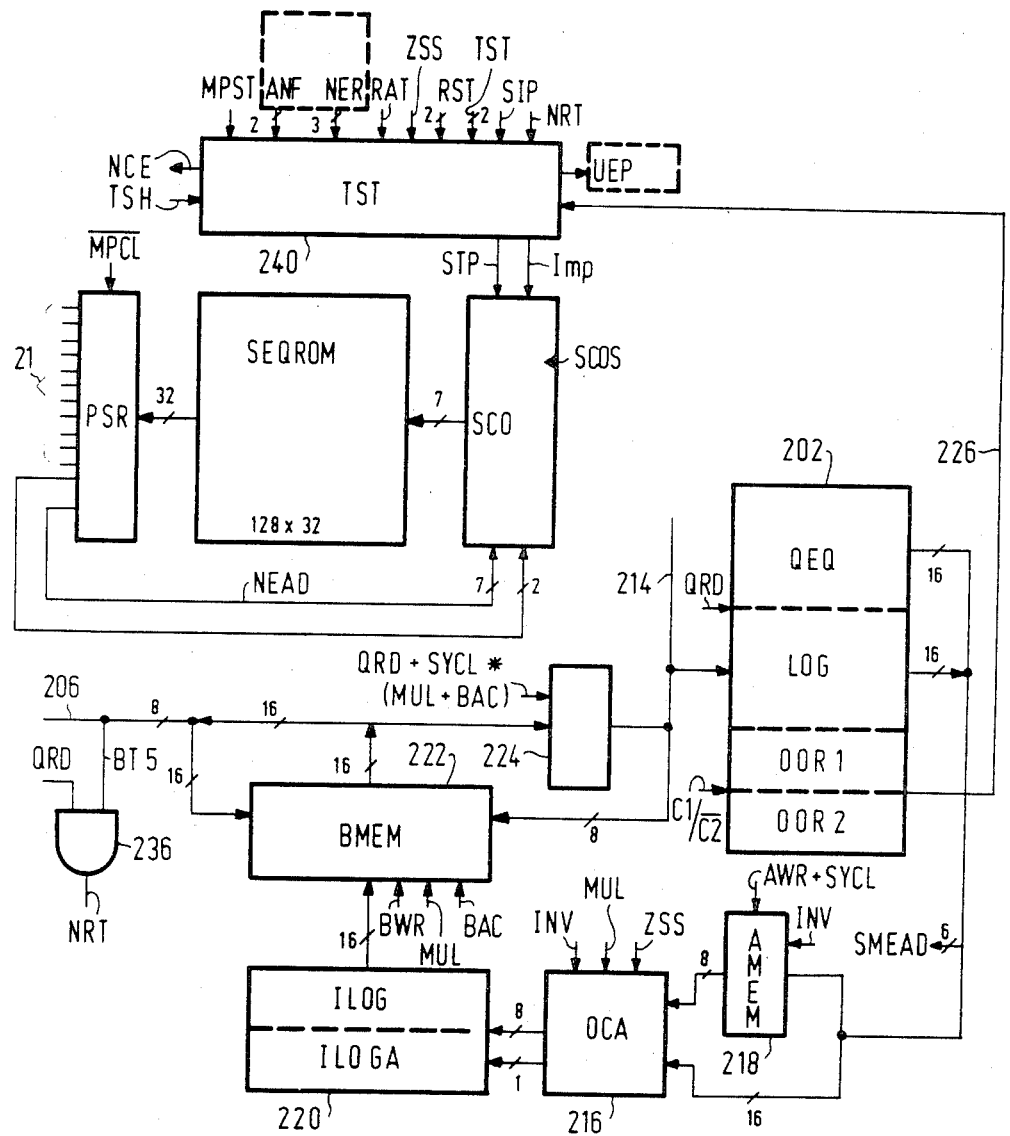

FIGS. 3a, 3b show a block diagram of the decoder 72. This decoder per se strongly resembles the decoder described in the simultaneously filed Netherlands Patent Application No. 8400629 corresponding to U.S. patent application Ser. No. 705,752, filed Feb. 26, 1985 in the name of Applicant which is incorporated herein by way of reference. The differences between the present Patent Application and the reference Patent Application concern notably, at least as regards the subsystem 72:

in the embodiment described hereinafter the minimum distance d of the code equals 5 (instead of 7);

the length of a code word amounts to no more than 32 symbols;

the number of erase symbols (NER) is externally applied, so that no further detection count is required;

due to the restrictive properties of the code, a number of simplifying steps are possible, so that savings can be achieved as regards the number of components required as well as regards the processing time.

The code symbols comprise 8 bits and are defined in a Galois-field GF ($2^8$) with a primitive and irreducible polynomial $x^8+x^4+x^3+x^2+1$. The generator polynomial of the code is a repeated product $g(x)=pi(x-a^{b+j})$, in which $j=0, \ldots 3$ and in which $b=0$. For the decoding, the symbols are byte-serially received by RES, that is to say 8 code bits and 2 bits of flag information from the FIFO buffer 42 (the connection for the flag bit information has been omitted in FIG. 2 for the sake of simplicity). Furthermore, per symbol the flag bit PES arrives from the generator 62 in FIG. 2. The code symbols are stored in the latch circuit NWS under the control of the storage signal MW. Subsequently, the symbols are applied to the exclusive-OR circuit XOR in which they are bit-wise added to the provisional syndome symbols stored in the registers IS∅...IS3. Subsequently, the result of the addition is temporarily stored in the register SR under the control of the signal IPT, after which it is returned, after multiplication or not by one or more factors "a" (the basic element of the Galois field), to the output register of the series IS∅...IS3. The triangles indicate the multiplication operation. A fourfold feedback is thus achieved. The indications R∅...R4 (R4 being coincident with RO of the next cycle) indicate that per cycle the registers are successively read (lowest Ri clock pulse: $i=0...4$) and subsequently written again (highes Ri clock pulse). When the entire code word has been received, the syndrome symbols are ready and are made available, via the latch circuit LAT and under the control of the syndrom read signal SRD, to the actual decoder (second arithmetic means). The start signal SIP acts to reset the registers of the syndrome generator to zero. The latch circuit LAT has a tristate output.

Upon reception of the symbols they are stored, via multiplexer 200, and together with the two-bit flag information, the bit PES and supplemented by an additional "0" bit, as twelve-bit quantities in the memory SME which has a capacity of 32 locations. The multiplexer 200 is controlled by said signal IPT. The addresses for the memory SME are supplied by the read-only memory 202. During one memory cycle, the memory SME can be read as well as written. The rewritten symbol may be an updated version of the symbol read or alternatively a symbol of the next code word. The read-only memory 202 itself is controlled by a counter LCO. This counter is set to the position HEXC∅=$a^{31}$ at the beginning of the reception of a code word, the counter position being divided by the symbol "$a^1$" (basic symbol of the Galois-field) in reaction to each reset step. The structure which is slightly more complex than that of a linear counter results in simplifications of the remainder of the circuit. The signal IPT acts as an enable signal for the counter, the signal MW as a reset signal and the signal SIP serves to realize the initial setting. Thus, a linearly decremented counter position is formed in the memory 202 which comprises the logarithm determining device LOG (so 256 words). The selection signal for activating the appropriate part LOG in the read-only memory 202 is the signal QRD. Each time 16-bit signals appear on the output, that is to say the value to be found in non-inverted form and also in bit-wise inverted form. This again leads to simplification of the circuit. The address SMEAD contains the six leastsignificant bits of the 8 non-inverted output bits. The bus 214 is shown partly in FIG. 3a and partly in FIG. 3b. The same is applicable to the bus 206 to be described hereinafter. The element 224 between these buses is shown twice.

The further output bits of the memory 202 will be discussed in detail hereinafter. The symbols are updated by initiating a read operation in the memory SME (address from memory 202) by a read control signal MR on the latch circuit 204. The input bus 206 of the exclusive-OR circuit 208 then carries the correction symbol, and the corrected symbol is again stored in the memory SME via the multiplexer 200. When there is a correction ≠0, each time the signal COR appears. When this signal appears for a symbol for which PES=0 (and set/reset flipflop 210 outputs a 1 on its Q̄ output), AND-gate 213 switches over the flipflop 210, thus forming the signal $\overline{ERUF}$ which indicates that a correction for an insuspect symbol has taken place for the relevant code word, so that the entire code word is considered to be suspect. This knowledge is used in the flag-hardening element 66 in FIG. 2. The resetting of $\overline{ERUF}$ at the beginning of a code word has been omitted for the sake of simplicity. The bit COR is also stored in the memory SME in the bit position previously filled with a "0" and then acts as the previously described signal SFL. The two-bit flag information from the memory SME bypasses the exclusive-OR circuit 208. The signal COR is also counted in the three-bit counter 212 in order to form the signal NSFL referred to in FIG. 6a. At the beginning of a code word, the counter 212 is reset by a signal RS. At the end of the correction of a code word, the symbols are made available on output COS, together with the two-bit flag information from RES and the flag SFL (=COR) (the flag PES is ignored). The memory SME thus has an internal storage function as well as a function for the intermediate storage of flag bits.

The elements 202, 216, 218, 220, 222, 224 form a subsystem for executing calculations in the Galois-field GF ($2^8$). The symbol to be processed arrives from the bus 214. The memory 202 is capable of selectively performing three operations:

part LOG determines the logarithm j of a symbol $a^j$ received. Multiplication can then be more readily performed than the addition of two exponents.

part QEQ determines a root of the square locator equation $X^2+X+B$ (B from BMEM 222, via QRD)=0 in order to find therefrom localization information for an incorrect symbol. In this case the signal QRD selects the part QEQ and also renders the tri-state buffer 224 conductive so that the quantity B can be fetched from the storage element 222.

part OOR determines whether the value j of a symbol rank number $a^j$ is within or outside the actual length of the code word (32 or 28 symbols). In the case of "outside", an error signal is produced on the line 226. The processing result of the parts QEQ, LOG is output to the elements 216, 218 (the addressing of the memory SME has already been described). The part OOR is always active, regardless of the value of QRD and also receives a selection signal C1/C2 for discrimination between the two codes. The different operation is symbolically denoted by distinguishing the parts OOR1, 2 for the two codes.

Elements 218 is an 8-bit register which stores the output value of the memory 202 either in inverted form or in non-inverted form under the selective control by the signal INV. This register thus also has a multiplexer effect. Storage control is performed by the AND-function between the clock signal SYCL (symbol clock) and the program signal AWR which is supplied by the internal sequencer of the decoder. Element 216 is an 8-bit adder. This element receives the control signal INV in order to make a selection between the symbol received from the memory 202 and the inverted value thereof, the signal MUL which activates an add operation (and hence a multiplication of two symbols), and the signal ZSS. The latter signal serves to produce a result "zero" (HEX$\emptyset\emptyset$) on the output of the element 216 when a zero symbol occurs as a factor in a multiplication. To this end, a zero symbol detector is connected to the bus 214. The zero symbol detector first of all comprises an 8-bit wide NOR-gate 228. This gate outputs a "1" under the control of a symbol consisting only of zero bits. To this gate there is connected a latch circuit 230 which is activated by the AND-function of the signal AWR and the symbol clock SYCL (this function is also used for writing a symbol in the element 218). Also provided is an enable gate 232 which is rendered conductive by the enable signal MUL, and an OR-gate 234 which ultimately supplies the signal ZSS. A correct operation is thus ensured for each of the zero symbols acting as a factor.

The adder 216 outputs an eight-bit symbol and also a ninth bit which represents an output carry signal. Element 220 is an antilogarithm generator. If no carry is formed by the adder 216, the output symbol $a^j$ is formed of a symbol j received. If such a carry is formed by the adder 216, in the element 220 the output symbol $a^{j+1}$ is formed of a symbol j received. The construction in the form of a read-only memory for 512 words of 8 bits each has been found to be faster than a set-up in which the address is recalculated. Note: this processing problem is due to the fact that the Galois-field in question comprises 256 elements, but the additions are performed modulo-255 therein. The read-only memory 220 outputs the symbols again in non-inverted form and in bit-wise inverted form. The double function of this memory is symbolized by the division into ILOG and ILOGA (inverse logarithms). Block 222 represents an 8-bit register which comprises a non-inverted and a bit-wise inverted output, 16 bits in total. The output is fed back to an input again over 16 bits via the bus 206. For the remainder only the "non-inverted" part of the output information is used for supply to exclusive-OR circuit 250 as a correction symbol or to a tri-state buffer 224. The element 222 furthermore receives the control signals SCOS, BWR, MUL and BAC for the implementation of a number of logic functions.

To the input of the element 222 there is connected an exclusive-OR circuit which is fed by the output of the element 220 and on the other side by a multiplexer. A first value of the signal BAC renders this multiplexer conductive for the signal of the bus 206. The second value controls this multiplexer as a generator for a "0" symbol.

The output of the exclusive-OR circuit forms a first input of a second multiplexer circuit. The second input of this second multiplexer circuit carries the 8-bit symbol of the bus 214, conducted or not by the tri-state buffer 224. This second input is conductive when the signal MUL =0 (no multiplication performed), and BAC=0 (coupling end-around in the first multiplexer function) and BWR=1 (write signal control). In all other cases the first input is conductive. To the output of the second multiplexer function there is connected the register function. If MUL=1 (multiplication) or BAC=1 (no coupling end-around) or BWR=1 (write control), the register will be filled. When all three control signals have the value zero, the content will be retained.

The tri-state buffer 224 is activated by a signal QRD+SYCL X (MUL+BAG) and conducts the non-inverted content of the register 222 to the bus 214 for possible further processing in the Galois field unit or for storage in the memory 238 (see hereinafter). The signal SYCL is the symbol clock which is generated by an internal clock generator of the circuit. The signal QRD is formed by the program (register PSR) in order to activate the element QEQ in the read-only memory 202. The signal QRD is combined in the AND-gate 236 with bit "5" of a quantity on the bus 206. This bis is "1" if the equation $X^2+X+B=0$ has no solution, which means that the relevant word is uncorrectable. The signal NRT formed is applied to a test element 240 in order to terminate the further processing of the word. Subsequently, the symbols of the word in question are output as COS.

Auxiliary memory 238 is bidirectionally connected to the bus 214. It notably comprises two memories HME (8 words of 8 bits), WME (4 words of 8 bits) and a buffer for the erase positions (four words of 8 bits). The auxiliary memory is intended for a variety of intermediate results. The section EEPF is addressed by the counter 240; this counter is preset when the code word is received, as symbols RES, and also when the decoding commences. Counting takes place when a symbol comprising an EEP flag is received and again when a next erase position is to be read (ERD). During write operations in this section, the position of the counter LCO indicates the erase position, so that a first-in-firstout buffer is obtained. Also shown is the synchronization by the clock signal SYCL.

The memory 238 thus comprises the storage sections HME, WME, EEPF, and a part I/O which symbolizes the control decoding. The following control and address signals are received:

HAD, WAD : addresses for HME, WME.

EEP: write operation in EEPF.

WWR, WRD: write and read operations, respectively in WME.

HWR, HRD: write and read operations, respectively in HME.

IDS: selects between direct and indirect writing, respectively in an auxiliary memory (i.e. via element OCA (216)).

SRD: (see also latch circuit LAT) controls the reading of the syndrom symbols from the register IS$\emptyset$...3 for storage herein.

ERD: read/erase position (from EEPF).

The sequencing of the decoding is performed by the parts PSR, SEQROM and SCO. Element SCO is a seven-bit address counter. Element SEQROM is a control memory having a capacity of 128 words of 30 bits each. Element PSR is a program status register which is loaded each time under the control of the inverted value of the microprocessor clock: $\overline{MPCL}$. The 30 output signals of the memory SEQROM are shown in FIG. 3c. The first bit selects between reading and writing in the memory section HME. The second bit selects between reading and writing in the memory section WME. The third and fourth bit are used for supply to the control counter: the execution time of an instruction can thus be determined to be 3, 4, 5 or 6 clock cycles. These two bits load the counter which is then decremented to a fixed value, thus enabling the addressing of a next memory location. The fifth bit controls the reading of a syndrome symbol. The sixth bit controls an inversion. The seventh bit controls a multiplication. The eight bit controls an accumulation. The ninth bit controls a register storage. The tenth bit control a furthe register storage. The eleventh and the twelfth bit form an address for the memory unit WME. The thirteenth to fifteenth bits form an address for the memory unit HME. The sixteenth bit controls a direct/indirect operation as described. The seventeenth to nineteenth bits are decoded; for values (0...4) these bits represent the number of erase positions (more than four is impossible because of the code distance of the code). Higher values may be used for further signalling. Twenty and twenty-one: result bits which indicate that the programm continues as usual (k=0), that the correction is impossible (k=1), or has been completed (k=2), or act for jump control (k=3). The twenty-second bit controls the execution of a test for determining whether or not a symbol position fits within the word length. The twenty-third bit signals that a correction has taken place. The twenty-fourth to thirtieth bits act as the new address in case of a jump must be made. These bits are returned to the address counter SCO.

The address counter SCO also receives five further signals:

JMP: a jump is to be made.

STP: stop control.

The two bits TIM$\emptyset$, 1 of the program status register PSR which indicate the cycle length. The signal SCOS is a clock pulse which decrements the counter position.

Finally, the circuit also comprises a test subsystem in which various conditions are tested (see also the flowchart of FIG. 3c). The following signals are received:

NER: indicates the number of erase symbols in a word (presented by the strategy ROM 44 in FIG. 2).

ANF: indicates the maximum permissible number of error symbols (non-erase symbols) beyond the number NER.

RAT: request signal from the register PSR in order to determine whether the symbol position is situated within the word; the output of the second OOR is thus activated.

ZSS: zero symbol.

NTR: equation $X^2+X+B=0$ has no solution.

MPST: start microprocessor so that all sequential elements assume an initial position.

TSH: auxiliary signal which indicates the reaching of the last SYCL clock pulse of the relevant cycle.

This subsystem outputs the following signals:

UEP: correction impossible.

NCE: number of corrected errors.

STP: already discussed.

JMP: already discussed.

FLOWCHART FOR THE DECODING

Figure 3D:
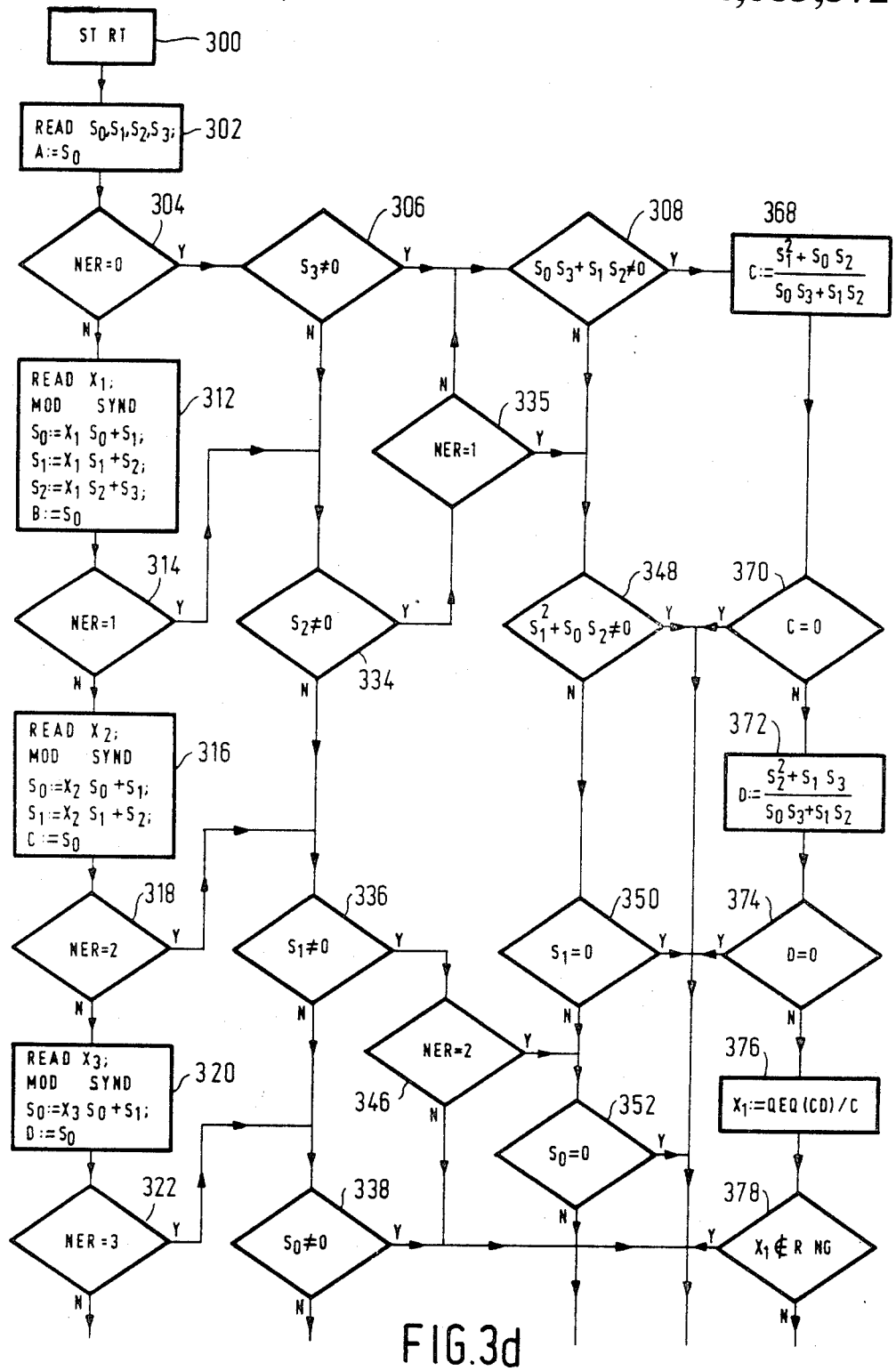
FIGS. 3d, 3e show a flowchart illustrating the operation of the decoder.
Figure 3E:
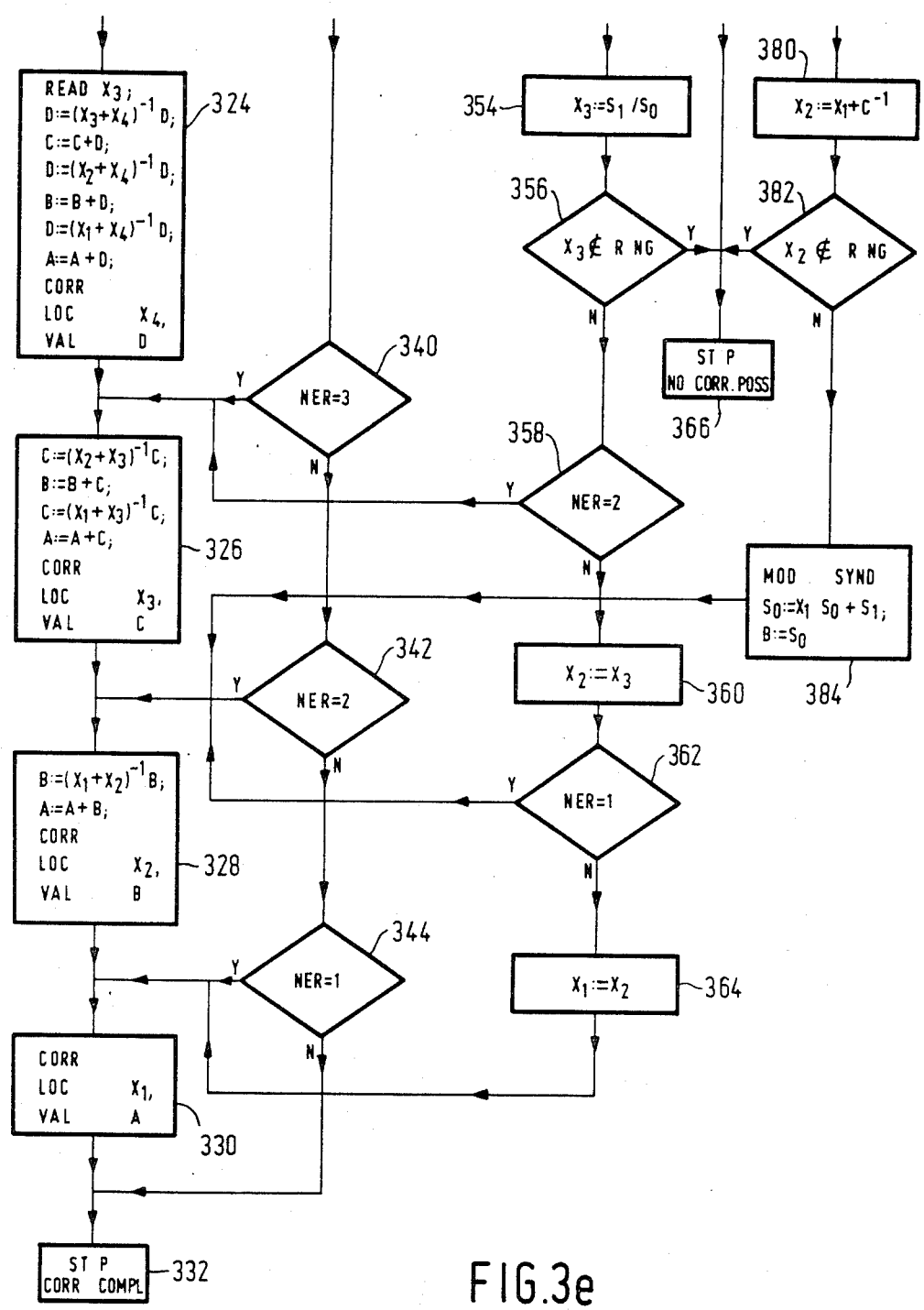

FIGS. 3d, 3e show a flowchart illustrating the operation of the actual decoder (element 72 in FIG. 2). In block 300 starting takes place at the instant at which all symbols have been taken up. In block 302 the four syndrome symbols S$\emptyset$...3 are read and the quantity A becomes S$\emptyset$. In block 304 it is detected whether the number of erase symbols is $\emptyset$. If this is so, the first column is departed from. The set-up of the flowchart is as follows: if there are no error symbols, the system will never proceed beyond the second column, and if there is only one error symbol, it will never proceed beyond the third column.

When there are erase symbols, in block 312 the first erase locator X1 is read; subsequently, the first three symbols are modified thereby as indicated, the auxiliary quantity B being made equal to the first, modified syndrone symbol. As from now on S3 will be ignored. In the blocks 314...324 each time a larger number of erase symbols is requested and in the case of a negative result, the syndromes are modified and the quantities C and D are successively postulated. Finally, in block 324 the error symbol Y4=D is determined in location X4. Subsequently, in the blocks 326, 328, 330 each time a known location, that is to say a root of the key equation found, is removed by division and a next error symbol is evaluated. The correction is completed in block 332. When the number of error symbols was smaller than four, the first column is left while in the blocks 306, 334, 336, 338 it is detected whether the successive syndrome symbols have the value zero. Furthermore, in the blocks 340, 342, 344 the successive numbers of erase symbols are tested. A completely correct code word thus directly proceeds the block 332. A code word containing less than four erase symbols follows a rout which partly bypasses the first column. For NER=3, block 324 is bypassed, unless the trice modified syndrome symbol is still unequal to zero at that instant; in that case the word is uncorrectable and the system proceeds to block 366. For NER=2, the blocks 320, 324, 326 are bypassed, but in that case the syndrome symbols S$\emptyset$, S1 must both be zero (336, 338). If S$\emptyset\neq$0 and also S1$\neq$0, an error symbol location is determined in block 354 which, however, must be situated (356)

within the length of the word. If this is so, the system proceeds to the block 326 in order to correct the two erase symbols and also the localized error symbol. If the result of one of the tests in the blocks 338, 352, 356 is negative, the system proceeds to the block 366 because the word is uncorrectable.

If the number of erase symbols NER=1 and S2, S1, S∅ are zero, the system proceeds directly from the block 314 to the block 330 and the correction has been completed. If in that case S1 or S∅ is not zero, the word is uncorrectable (if S2=∅). However, if S2≠∅, the system proceeds to the blocks 335 and 348 in order to perform a test. The system can proceed to the block 328 via the relevant column in order to correct the one erase symbol and the one correction symbol only if the stated expression has the value zero.

If the value NER=0, and one (or both) syndrome symbols S2, S3≠0, the test in block 308 is performed. If this function equals zero, like the function in block 348, the already described column can be completed down to the bottom (block 364) and the system reaches the block 330 in order to correct one error symbol. When the function in block 308 is unequal to zero, the quantity C is determined in block 368; it being equal to zero is then tested in block 370 (actually, this test is the same as that performed in block 348). Subsequently, the quantity D is calculated (and tested) and the location of the first error symbol is determined by a read operation in a read-only memory QEQ which has already been described.

Subsequently, the second error location is determined; both locations must be situated within the code word (378, 382). Subsequently, in block 384 the syndrome S∅ is updated; the processing is identical to the case concerning two erase symbols. Other possibilities are similarly executed in the Figure.

Figure 4:
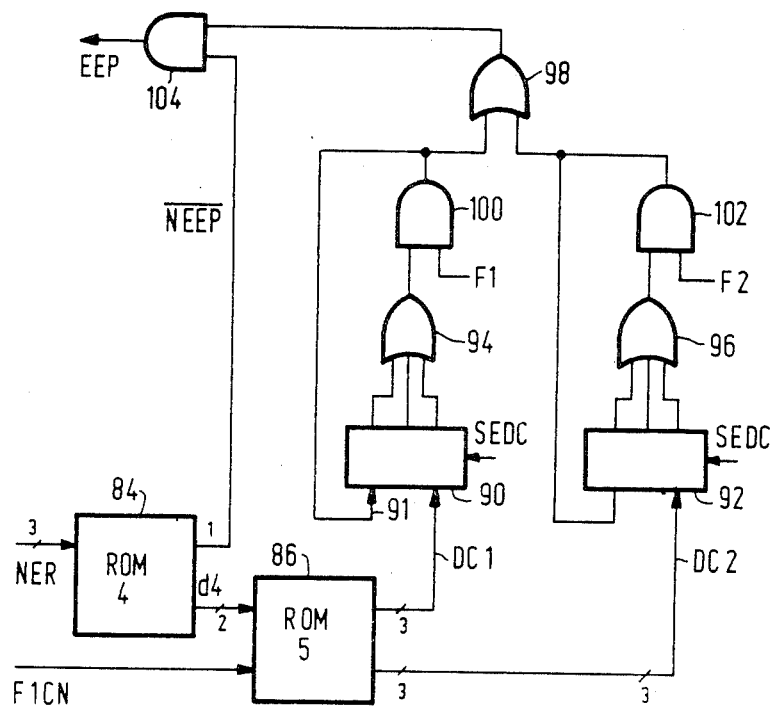
FIG. 4 shows a diagram of the device for forming the signal EEP.

FIG. 4 shows a block diagram of a device for forming the signal EEP (expected eraseure position) in the pointer generator 64. An erase position is predicted therein on the basis of the counting sums of the "hardest" flags. The number of erase positions may not be larger than the number NER supplied by the strategy-determining memory 44. The circuit distributes the number of flags EEP permissible for the strategy so that they are first assigned to symbols for which F1 flag bits are applicable. For the second code, the remainder of this permissible number is assigned to symbols for which F2 flags are applicable. Any surplus flags are not used in both codes. The circuit comprises two read-only memories 84 (eight words of 3 bits) and 86 (32 words of 6 bits), two 3-bit counters 90, 92, three OR-gates 94, 96, 98 and three AND-gates 100, 102, 104. In another embodiment, the read-only memories are replaced by so-called wild logic circuits, the combinatory functions, however, remaining the same.

The read-only memory 84 receives the signal NER which indicates, as has already been stated, the number of erase symbols to be treated per code word: at least "0" and at the most "4". This is a quantity which is determined by the strategy followed and which is supplied by the read-only memory 44. Values higher than 4 are not used. Therefrom the signal NEEP is derived which is true only if there are no symbols to be treated as an erase symbol (NER=0). Moreover, in the read-only memory 84 the number of erase symbols to be treated (1 ... 4) is recorded into a two-bit erase signal d4 which is applied to the read-only memory 86. The further input information of the memory 86 consists of the counting sum of the F1 flags: F1CN. The following information is formed therefrom:

a. a three-bit quantity DC1 which is equal to the lowest value of the pair F1CN, NER: min (F1CN, NER). It indicates the number of erase symbols for which the F1 flag is used as a pointer.
b. a three-bit quantity DC2 which is equal to the difference (NER-DC1).

Under the control of the signal SEDC, the counter 90 is loaded with the information DC1. For as long as this counter has not yet reached its zero position, the OR-gate 94 outputs a "1" because in that case at least one of the three-bit stages still contains a logic "1". Each time when an F1 flag appears for the actual symbol, AND-gate 100 outputs a "1" and the counter 90 is decremented by a signal on the line 91. When a counter 90 reaches the position zero, the OR-gate 94 receives no "1" signal whatsoever and the decrementation is blocked. Furthermore, each decrementation pulse is output as a signal EEP via the OR-gate 98 and the AND-gate 104. It is only when not a single erase symbol may be taken into consideration for the relevant code word (so only error symbols) that the signal EEP cannot be formed because of blocking. The information DC2 indicates the number of erase symbols for which the flags F2 act as pointer symbols. Due to the formation of the flags F1, F2, they never occur simultaneously for the same symbol. The output signal DC2 is processed in the same way as output signal DC1.

Figure 5:
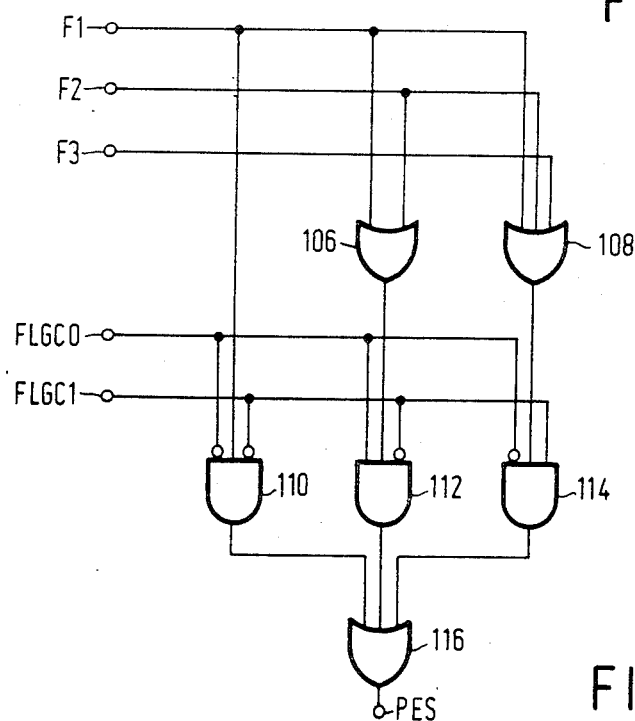
FIG. 5 shows a diagram of a device for forming the signal PES.

As a further part of the pointer generator, FIG. 5 shows a device for forming the signal PES (possible error). While the signal EEP renders a symbol very suspect so that it will almost certainly be corrected, the signal PES is used as a check (gate 212 in FIG. 3) in order to use the correction of completely insuspect symbols (PES=0) as an indication for a probably incorrect correction. The three primary flags F1 ... 3 are combined by means of OR gates 106 and 108. The second discrimination code FLGC is supplied by the strategy-determining memory 44. When FLGC has the value "00", the flag F1 is passed on: PES=F1. When FLGC has the value "10", PES becomes equal to the OR-function of the flags F1 and F2. When FLGC has the value "01", PES becomes equal to the OR-function of all three flags F1, F2, F3. The OR-gate 116 then combines the output signals of the AND/NAND-gates 110, 112, 114. The circles at the AND-gates 110, 112, 114 signify inverting inputs. By converting more flag categories (F2, F3) into PES flag bits, the safety margin is increased. On the other hand, it is also advantageous to minimize the number of PES flags in a code word, because otherwise a correction in a symbol not indicated by a PES flag becomes unlikely, even in the case that a word is actually uncorrectable. It has been found that the $\overline{\text{ERUF}}$ flag is a very attractive signalling instrument.

Figure 6A:
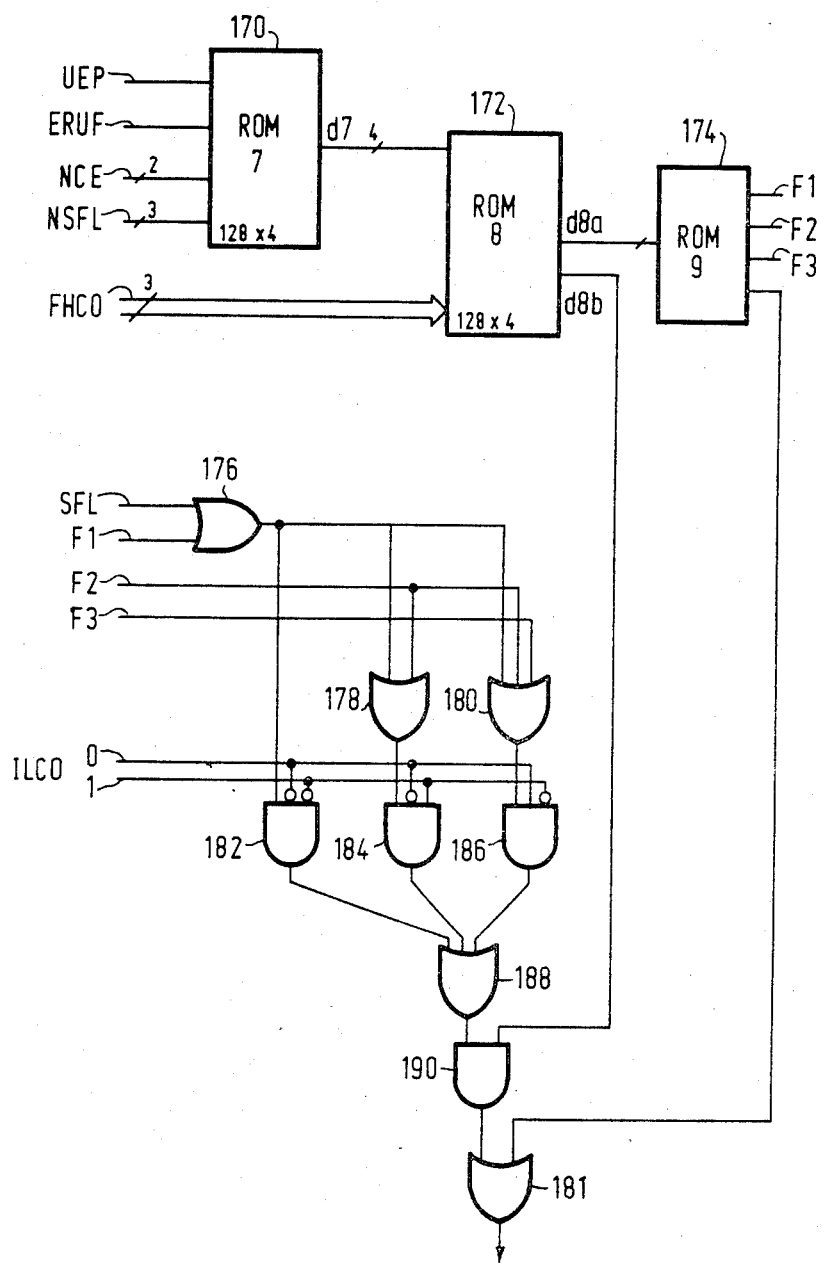

FIGS. 6a, 6b, 6c show a diagram of the flag-hardening element 66 of FIG. 2. On the basis of the coding results of the first code, this element first of all forms the flag bits F1, F2, F3 (again to be encoded as two-bit flag information) for symbols which are yet to be treated by the second code. Furthermore, this circuit forms the signal URD (unreliable data) which is also applied to the element 80 in FIG. 2, together with the output symbols. For each symbol at the most one flag bit F1 ... 3 is given, that is to say that flag bit which provides a realistic prediction of the possibility of an incorrect (or incorrectly corrected) symbol. It is to be noted that all symbols of a code word of the first code always obtain either no flag bit or the same flag bit F1, F2, F3 so that within a code word of the second code a symbol indicated by F1 is also more likely to be incorrect than a symbol indicated by a flag F2 or F3. The same holds good for the symbols indicated by F2 and F3.

The circuit (FIG. 6a) comprises a read-only memory 170 (128 words of 4 bits), 172, (128 words of 4 bits) and 174 (8 words of 4 bits), OR-gates 176, 178, 180, 181, 188, and AND-gates 182, 184, 186, 190. If desirable, the read-only memories may again be replaced by wild-logic circuits. The read-only memory 170 receives the information UEP (decoding was impossible due to an excessively large number of additional error symbols), $\overline{ERUF}$ (symbol error found which was not indicated by the pointer bit PES), NCE (number of corrected errors beyond the erase symbols (two bits)), and NSFL (number of SFL flags detected by the decoding device for which a correction has thus been performed). The content of this read-only memory is independent of the strategy followed. FIG. 6b systematically shows the feasible input signals NSFL, NCE, $\overline{ERUF}$ and UEP, the output signals DRM7 thereof, and the situation in terms of numbers of corrected symbols "t" and number of erase symbols "e"; there are no other possibilities. The last line means: uncorrectable, so in all cases for which $e+2t>4$ because of the distance $d=5$ of the code used herein.

The read-only memory 172 receives the three-bit information FHCO in addition to the four-bit code d4. This information FHCO is the so-called flag-hardening code or risk indication code which is supplied by the read-only memory containing the strategy-determining information (44). This code determines the risk. FIG. 6c shows the functions formed by the read-only memory 172. All possibilities for the three-bit code FHCO are plotted along the horizontal axis (top). The left column contains the possibilities for the input code (result of FIG. 6b). The columns also contain the results d8a (a) as a three-bit code (octal), and the bid d8b. "x" means "information irrelevant" as usual; "n" means "not programmed", and in this context "information irrelevant", while in practice always a "0" is programmed. The read-only memory 174 receives a four-bit code d8a which is coded from binary to 0/1 out of four. When the code is "0", no output flags are issued. When the code is "1", all symbols of the relevant code word are provided with F1 flags. When the code is "2", all symbols of the relevant code word are provided with F2 flags. When the code is "3", all symbols of the relevant code word are provided with F3 flags. When the code is "7", all symbols of the relevant code word are provided with "MUT" flags which are converted into URD output flags in gate 181. Symbols indicated by the F1 flags are most suspect as has already been explained.

The bit formed by the memory 172 is used to (un)-block the AND-gate 190 for the signal URD formed by the remainder of the circuit. As is shown, this signal is formed by a circuit which closely resembles that shown in FIG. 5. The first discrimination code ILSO (0 ... 1) is supplied again by the strategy-determining memory 44.

The F1 ... 3 flags are output mainly in the cases FHCO=(0 ... 4); this code indicates the reliability level. For FHCO=5, only F2 flags are output if not a single error or erase symbol has been found (first line of FIG. 6b). For HFCO=6, 7, even no flags at all are output, because there is a much higher risk of a UEP (uncorrectability) indication. For FHCO=7 and an uncorrectable situation (signalled by $\overline{ERUF}=1$ or UEP=1), the information "7" is output by the memory 172. This means that though a rather problem-free situation exists, still no correction can be performed. It has been found that this may happen when the detector jumps from a first track to a second track during the scanning of the "Compact Disc". Completely incorrect symbols would then be grouped within one code word. The aftertreatment (interpolation etc.) must then also be activated, signalled by the signal URD.

Figure 7A:
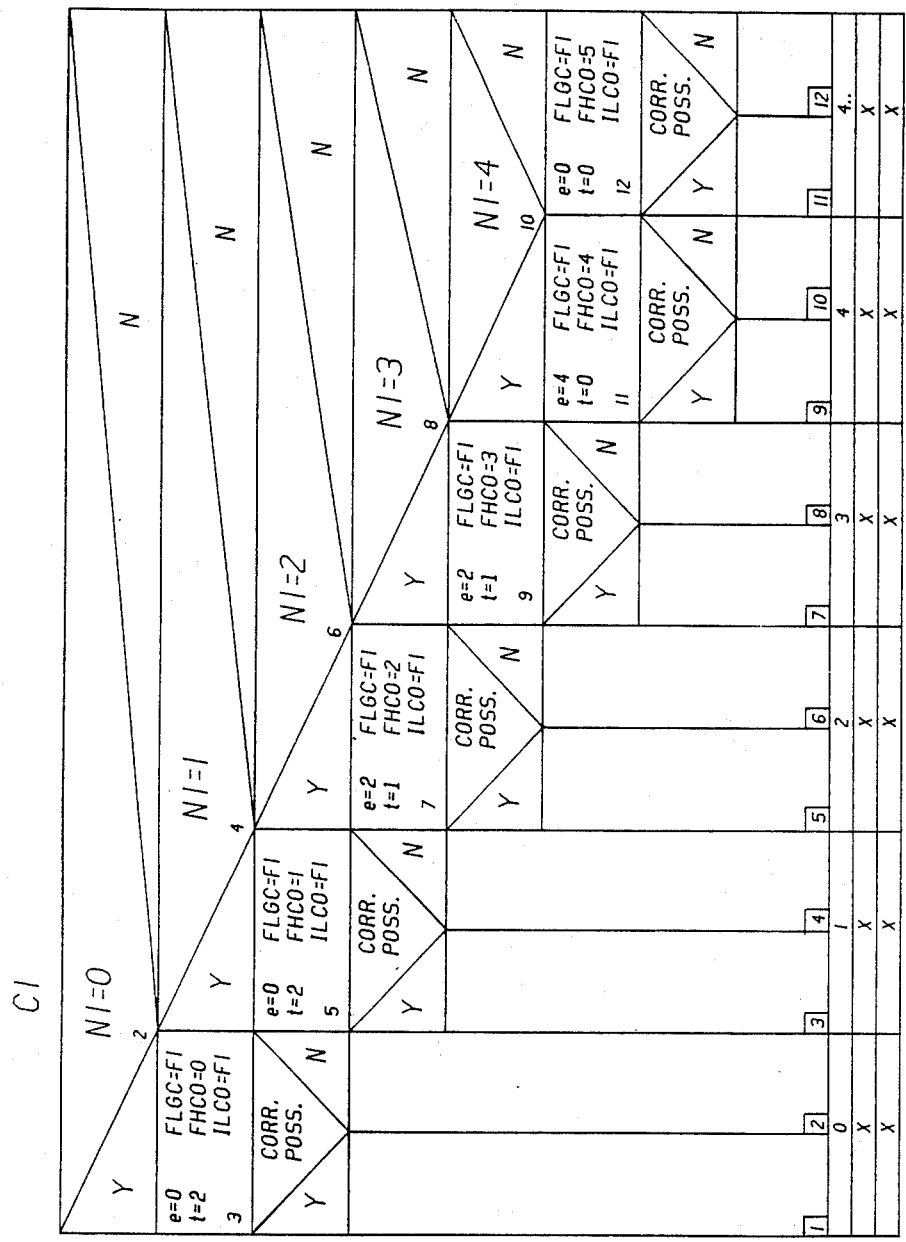
FIGS. 7a, 7b, 7c, 7d, 7e, 7f show a decision diagram for determining the strategy to be followed. Description of the code.

FIGS. 7a, 7b, 7c, 7d, 7e, 7f show a decision diagram for the strategies to be followed, that is to say for the section outside the actual decoder (72 in FIG. 3). FIG. 7a concerns the first (C1) code. First of all it is detected whether the number of F1 flags (N1) equals zero. If this is so (Y), the strategy-determining device indicates that a code word comprising zero erase symbols and at the most two error symbols is to be treated. If the number of F1 flags deviates from zero (N), it is tested whether the number is exactly equal to 1 and so on. The quantities FLGC, FHCO and ILCO indicate the described output signals of the strategy-determining read-only memory (44). Subsequently, it is detected whether correction is possible; if correction is possible, it is also executed. If correction is not possible, a relevant indication is given by one or more of the described elements in the FIGS. 2, 3. The last branch thus results in two possibilities. The device operates similarly for other numbers of F1 flags. The digits 1 ... 12 represent the enumeration of the possible results. The three lower-most lines contain the numbers of F1, F2, F3 flags per code word; the remainder of the Figure shows the sequence of the various possible branches for dealing with these cases.

Figure 7B:
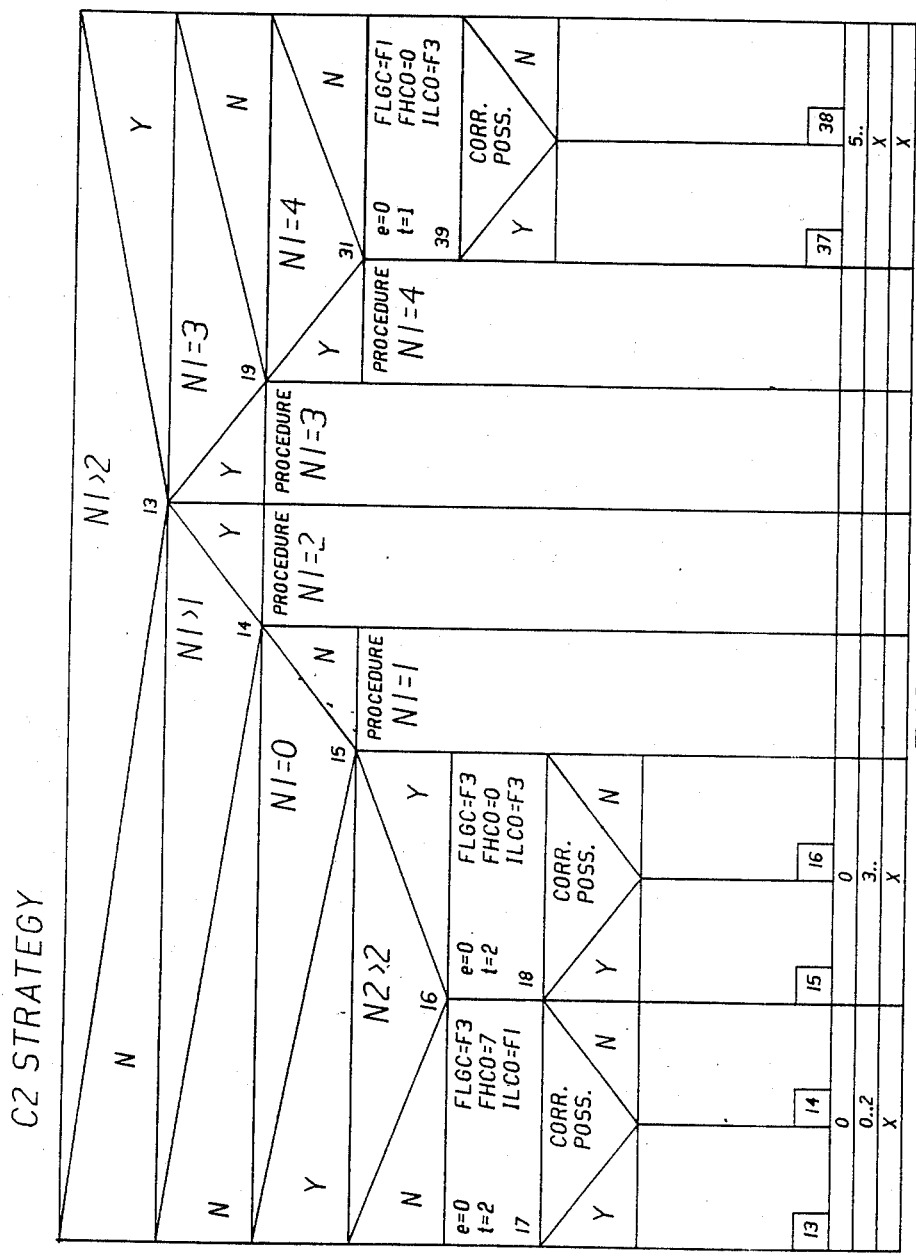
Figure 7C:
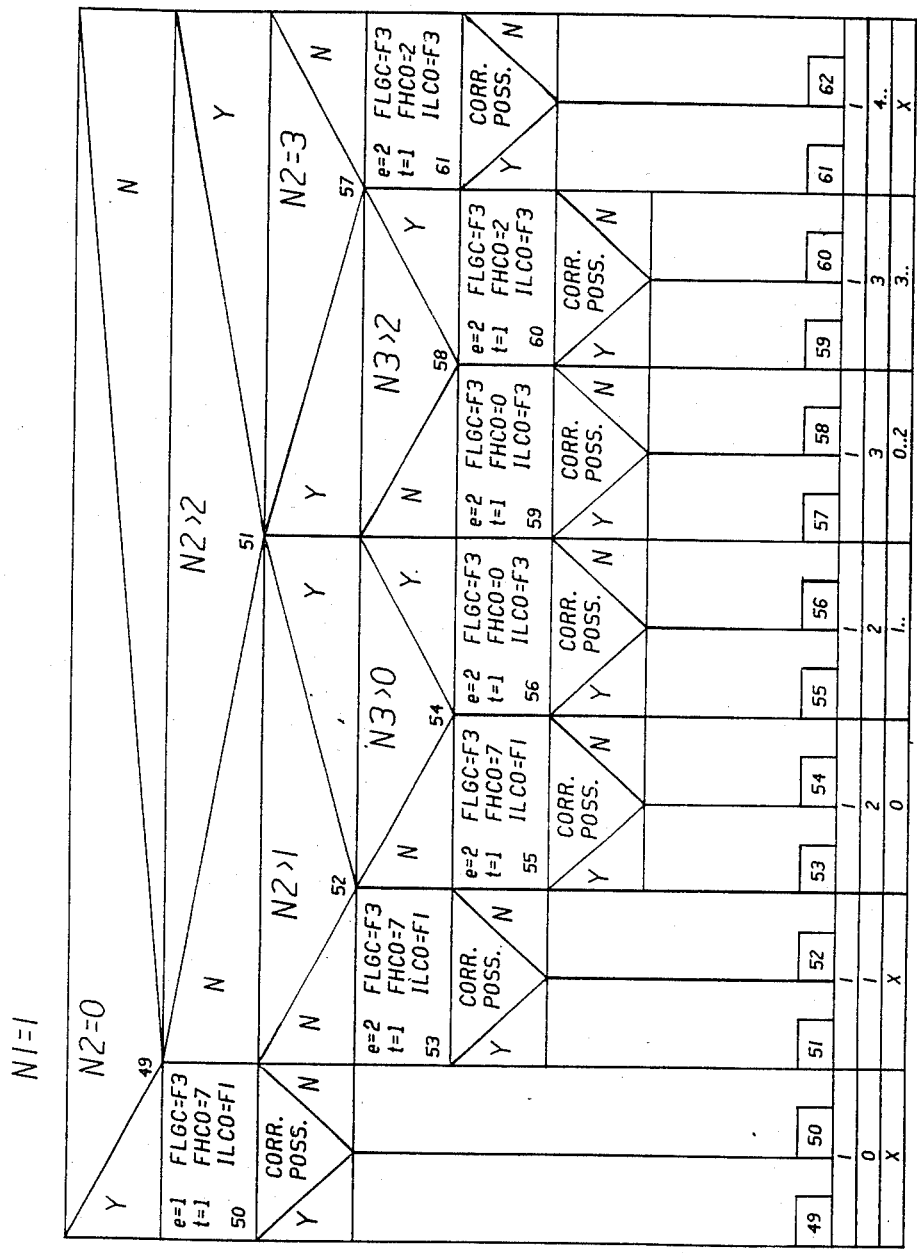
Figure 7D:
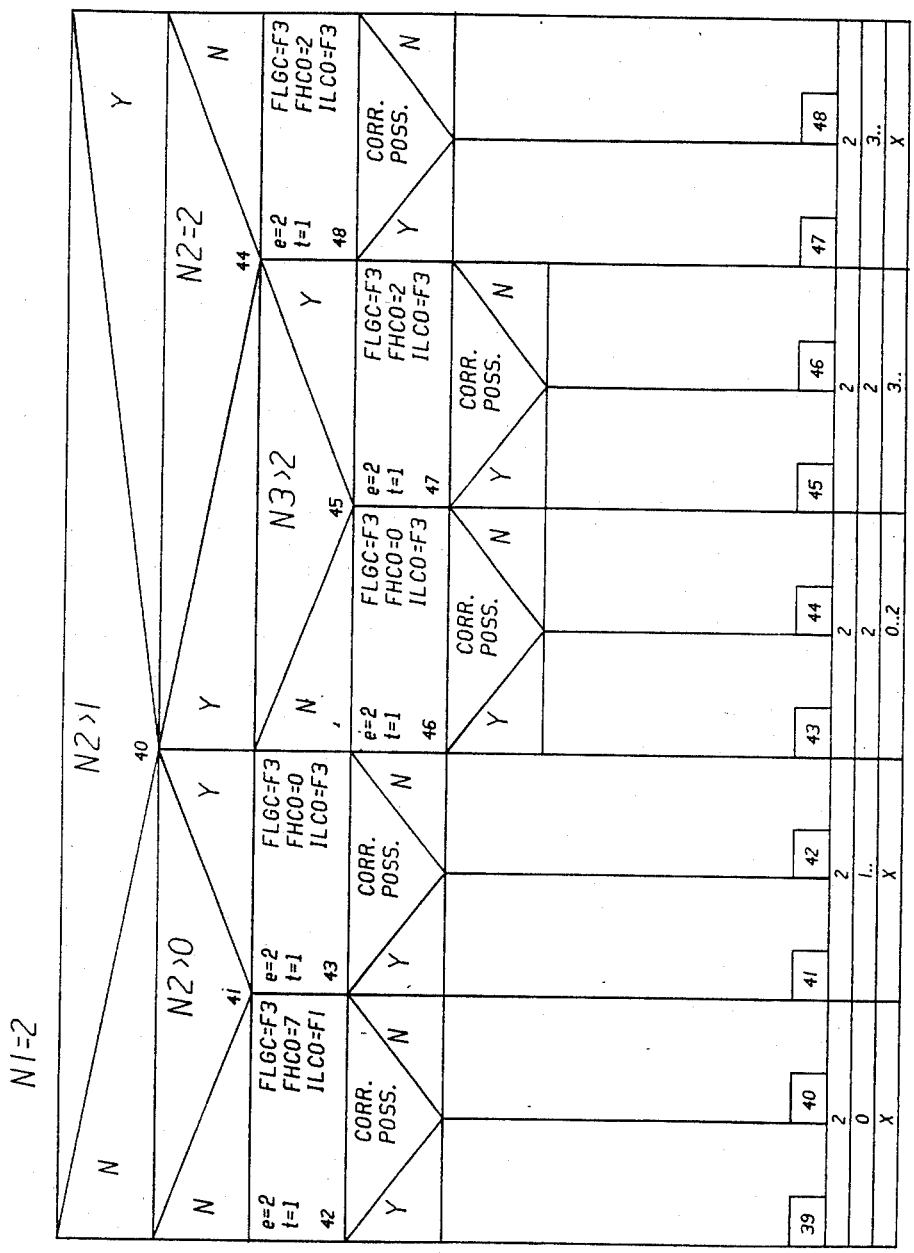
Figure 7E:
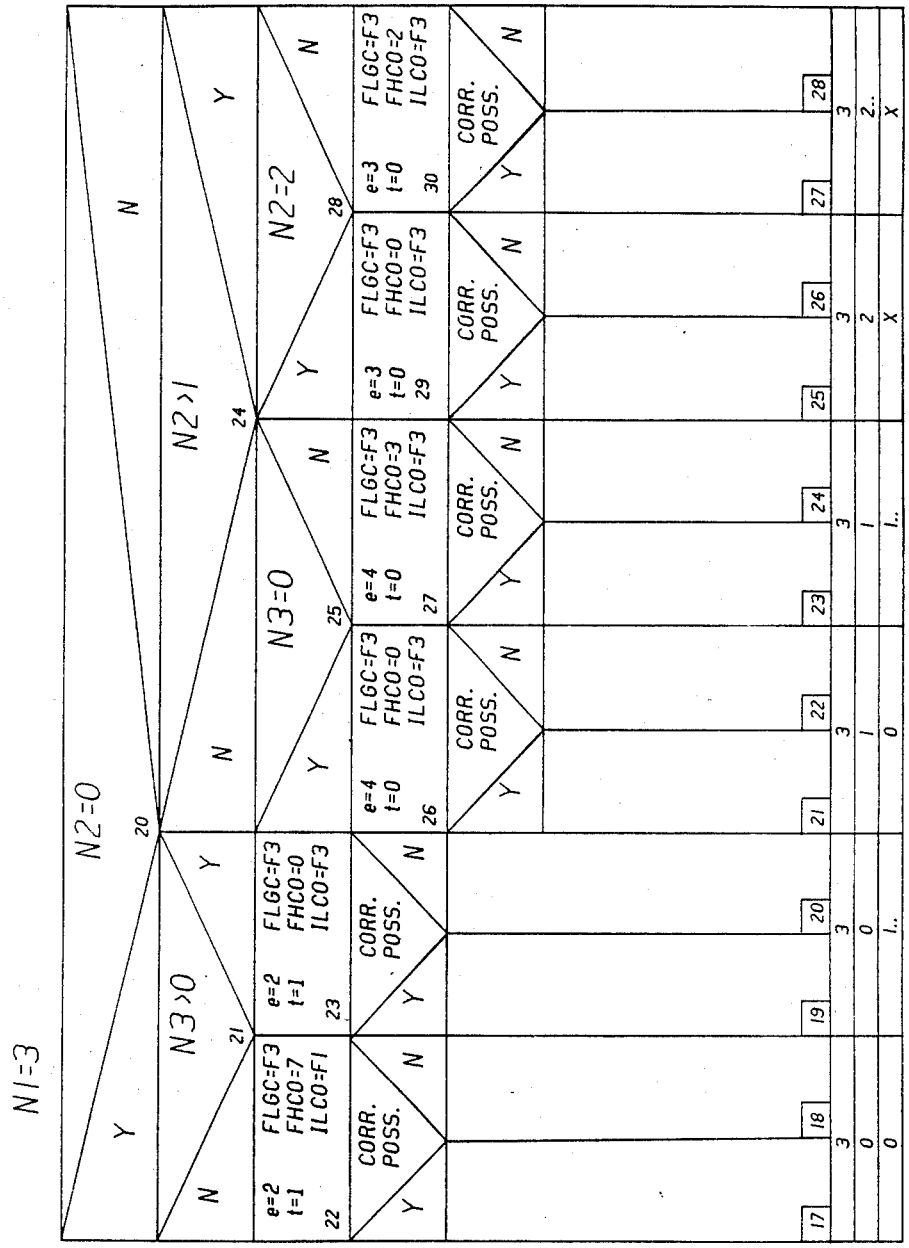
Figure 7F:
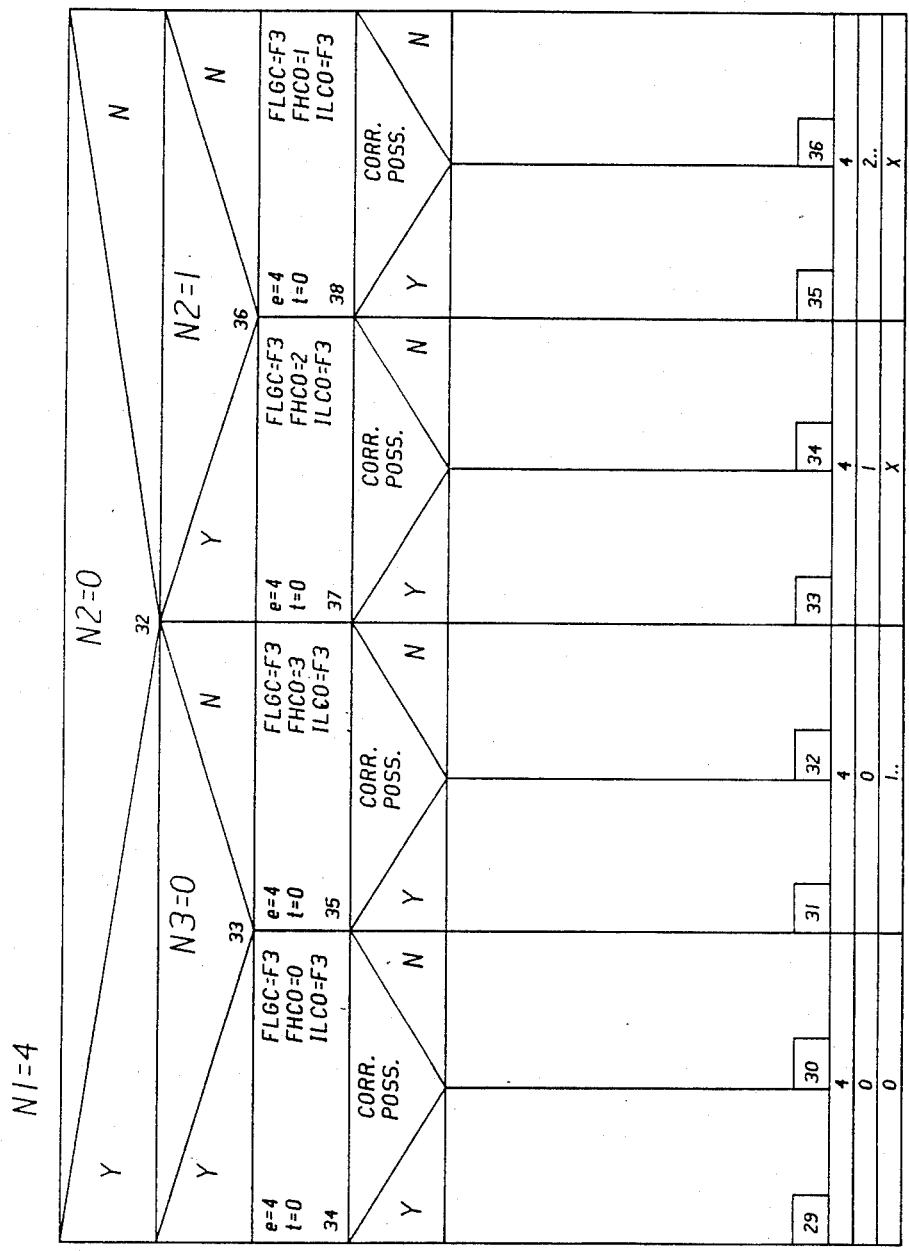

FIG. 7b shows the same for the second code (C2). For the determination of the strategy, the number of F2 flags is also tested (N2). The Figure shows a number of direct cases. For a number F1 flags between 1 and 4 separate procedures are feasible, said procedures being shown in the respective FIGS. 7c–f. Sometimes the number of F3 flags is then also taken into account (F3). Each of the ultimately feasible cases may result in a correctable as well as in an uncorrectable situation.

What is claimed is

1. A decoding device for a stream of successive code symbols which are protected against symbol errors by a pair of a first and a second cross-interleaved Reed-Solomon codes, the respective symbols of any particular multi-symbol code word of the second code all belonging to different multi-symbol code words of the first code, comprising:
   a first input for receiving code symbols of the first code, each associated with a reliability information code in the form of at least one reliability bit;
   storage means connected to said first input for storing data symbols of code words of the first code as received, data symbols of code words of the second code, and said reliability information code, said data symbols of the first code if corrected for an error therein by means of the first code, being stored after such correction, until at least all symbols of the relevant code word of the second code are stored together in said storage means,
   a first strategy-determining device connected to said first input for receiving, for each code word of the first code, the reliability information code of the symbols contained in the first code word, generating an aggregate reliability information signal for this code word, and generating a strategy indicating signal, said strategy indicating signal identifying a predetermined fixed number of erase symbols in said first code word and also a maximum number of error symbols above said fixed number of erase symbols that is accepted as being correctable, and further, generating a risk indication code (FHCO);

first arithmetic means for receiving all symbols of any code word of the first code and generating therefrom associated first syndrome symbols for such code word;

second arithmetic means connected to said first strategy-determining device for receiving said strategy-indicating signal, connected to said first arithmetic means for receiving said first syndrome symbols, connected to said storage means for accessing selected code symbols and said associated reliability information code for correcting said code symbol by means of an error value calculated therefor, and returning such corrected code symbols to said storage means, and for generating word-wise signalization information (UEP, ERUF, NCE, NSFL) signalling a measure of decoding success;

flag processing means including flag hardening element connected to said second arithmetic means for receiving such word-wise signalization information, and to said first strategy-determining device for receiving said risk-indicating code, and generating therefrom for each code symbol of the first code word, a secondary flag information (O, F3, F2, F1) having a value range of at least three discrete values; and indicating a secondary reliability; and further processing means connected to said storage means for receiving code symbols associated with a code word of the second code and associated secondary flag information, for generating therefrom second syndrome symbols, error locator information, and error value information calculated therefor, and supplying data symbols of a code word of the second code after error processing on a user output.

2. A decoding device as claimed in claim 1 further comprising a second strategy-determining device which comprises an input for receiving aggregate reliability information of a code word of the second code, formed on the basis of the secondary flag information, in order to determine a decoding strategy which is based thereon, and which requires a predetermined number of erase symbols to be treated in the relevant code word and a maximum number of error symbols which is accepted as being correctable.

3. A decoding device as claimed in claim 2, wherein the flag-hardening element for the decoding of a code word of the second code comprises a third input for receiving for each code symbol of the second code word, the multivalent secondary flag information (O, F3, F2, F1) and a correction indication (SFL), and a fourth input for receiving from the strategy-determining device a first discrimination code (ILCO) for selectively assigning to symbols which are indicated by the secondary flag information as being below a predetermined reliability level a reject signal on a second output.

4. A decoding device as claimed in claim 3, wherein the flag hardening element comprises logic means for forming a blocking/unblocking signal for the second output thereof on the basis of information received on first and its second input.

5. A decoding device as claimed in claim 2, including a first decoder for converting a number of at least two reliability data which are received for each code symbol into a multivalent primary flag information for the code symbol to the second arithmetic means and in aggregate form to the first strategy-determining device.

6. A decoding device as claimed in claim 2, wherein there is provided a first counter for summing the primary flag information for a code word of the first code, an output of said counter being connected to a comparison element which forms part of the first strategy-determining device and an output of which is connected to a control input of the first strategy-determining device.

7. A decoding device as claimed in claim 6, wherein there is provided a second multiple counter (F1CN, F2CN, F3CN) for separately summing the multivalent secondary flag information for a code word of the second code, an output of said second counter being connected, by a selection element, to a comparison element which forms part of the second strategy-determining device and an output of which is connected to a control input of the second strategy-determining device.

8. A decoding device as claimed in claim 7, wherein said first counter forms part of said second counter.

9. A decoding device as claimed in claim 6, 7 or 8, each of said strategy-determining device comprises a sequential circuit, and an associated control input providing a jump control input for the control of an address jump.

10. A decoding device as claimed in claim 9, wherein said strategy-determining device comprises a stop output for enabling further elements of the circuit in a strategy-determined manner after completion of the strategy-determination.

11. A decoding device as claimed in claim 10 further comprising pointer generator which comprises first input means for receiving the reliability information of a code word, second input means for receiving from any strategy-determining device the number of erase symbols to be treated, third input means for receiving the count from any counter, and distribution means for positioning erase flags (EEP) at a code symbol indicated by a reliability information of insufficient quality (F1, F2) for the extent of said number, and output means which are connected to said second arithmetic means.

12. A decoding device as claimed in claim 10 wherein there is provided a pointer generator which comprises first input means for receiving the reliability information of a code word, fourth input means for receiving a second discrimination code (FLGC0, 1) from the strategy-determining device, and second output means for outputting received reliability information which indicates a reliability of a level lower than indicated by the second discrimination code to the second arithmetic means as a possible error symbol indication (PES).

13. A decoding device according to claim 1, wherein said first input is connected to a player for optically readable record carriers to provide said code symbols of the first code.

* * * * *

UNITED STATES PATENT AND TRADEMARK OFFICE
CERTIFICATE OF CORRECTION

PATENT NO. : 4.683.572
DATED : July 28. 1987
INVENTOR(S) : Constant P.M.J. Baggen , et al It is certified that error appears in the above-identified patent and that said Letters Patent is hereby corrected as shown below:

IN THE CLAIMS

| | | |
|---|---|---|
| Col. 21, Claim 1. line 18 | delete "said" insert --such-- |
| Claim 3. line 65 | after "signal" insert --(URD)-- |
| Col. 22, Claim 4. line 4 | after "on" second occurence, insert --its-- |
| line 5 | delete "its" |
| Claim 5. line 9 | after "the" insert --respective-- |
| Claim 7. line 25 | delete "which forms part" |
| Claim 9. line 31 | delete "device" insert --devices-- |
| Claim 11. line 41 | after "comprising" insert --a-- |
| Claim 12. line 55 | delete "(FLGC0 , 1)" insert --(FLGC∅ , 1)-- |

Signed and Sealed this

Fifteenth Day of November, 1988

Attest:

DONALD J. QUIGG

Attesting Officer

Commissioner of Patents and Trademarks